US008383929B2

(12) United States Patent
Milshtein et al.

(10) Patent No.: US 8,383,929 B2
(45) Date of Patent: Feb. 26, 2013

(54) ELONGATED PHOTOVOLTAIC DEVICES, METHODS OF MAKING SAME, AND SYSTEMS FOR MAKING SAME

(75) Inventors: Erel Milshtein, Cupertino, CA (US); Benyamin Buller, Sylvania, OH (US)

(73) Assignee: Solyndra LLC, Fremont, CA (US)

( * ) Notice: Subject to any disclaimer, the term of this patent is extended or adjusted under 35 U.S.C. 154(b) by 319 days.

(21) Appl. No.: 12/502,978

(22) Filed: Jul. 14, 2009

(65) Prior Publication Data

US 2010/0012167 A1    Jan. 21, 2010

Related U.S. Application Data

(60) Provisional application No. 61/082,152, filed on Jul. 18, 2008.

(51) Int. Cl.
*H01L 31/05* (2006.01)
*H01L 31/042* (2006.01)

(52) U.S. Cl. ........ 136/251; 136/244; 136/246; 136/256; 136/265; 257/E27.123; 257/E27.126

(58) Field of Classification Search ........... 136/256, 136/246, 243, 251; 438/73; 257/E27.123–E27.126
See application file for complete search history.

(56) References Cited

U.S. PATENT DOCUMENTS

RE29,833 E  * 11/1978  Mlavsky ................. 136/246
7,235,736 B1   6/2007  Buller et al.

2005/0040374 A1 *  2/2005  Chittibabu et al. ....... 252/501.1
2008/0047599 A1 *  2/2008  Buller et al. ............. 136/251
2008/0110491 A1 *  5/2008  Buller et al. ............. 136/249

FOREIGN PATENT DOCUMENTS

| JP | 59 047773 A | 3/1984 |
| WO | WO 2007/002110 A2 | 1/2007 |

OTHER PUBLICATIONS

ISA/EPO, PCT Search Report and Written Opinion of the International Searching Authority dated Mar. 18, 2010 for International patent application No. PCT/US2009/004176.

* cited by examiner

*Primary Examiner* — Mamadou Diallo
(74) *Attorney, Agent, or Firm* — Morgan, Lewis & Bockius LLP

(57) ABSTRACT

Under one aspect, a nonplanar photovoltaic module having a length includes: (a) an elongated nonplanar substrate; and (b) a plurality of solar cells disposed on the elongated nonplanar substrate, wherein each solar cell in the plurality of solar cells is defined by (i) a plurality of grooves around the nonplanar photovoltaic module and (ii) a groove along the length of the photovoltaic module. In some embodiments, each groove of the plurality of grooves about the photovoltaic module, independently, has a repeating pattern, a non-repeating pattern, or is helical. In some embodiments, the module further includes a patterned conductor providing serial electrical communication between adjacent solar cells. In some embodiments, portions of the patterned conductor providing serial electrical communication between adjacent solar cells are within a groove of the plurality of grooves about the photovoltaic module.

39 Claims, 13 Drawing Sheets

ELONGATED PHOTOVOLTAIC DEVICES, METHODS OF MAKING SAME, AND SYSTEMS FOR MAKING SAME

CROSS REFERENCE TO RELATED APPLICATION

This application claims benefit, under 35 U.S.C. §119(e), of U.S. Provisional Patent Application No. 61/082,152, filed on Jul. 18, 2008, which is hereby incorporated by reference herein in its entirety.

FIELD OF THE APPLICATION

This application relates to systems and methods for monolithically integrated solar cells.

BACKGROUND OF THE APPLICATION

The solar cells of photovoltaic modules are typically fabricated as separate physical entities with light gathering surface areas on the order of 4-6 cm$^2$ or larger. For this reason, it is standard practice for power generating applications to mount photovoltaic modules containing one or more solar cells in a flat array on a supporting substrate or panel so that their light gathering surfaces provide an approximation of a single large light gathering surface. Also, since each solar cell itself generates only a small amount of power, the required voltage and/or current is realized by interconnecting the solar cells of the module in a series and/or parallel matrix.

A conventional prior art photovoltaic module 10 is shown in FIG. 6. A photovoltaic module 10 can typically have one or more photovoltaic cells (solar cells) 12a-12b disposed within it. Because of the large range in the thickness of the different layers in a solar cell, the cells 12a, 12b, and other cells described herein are depicted schematically. Moreover, FIG. 6 is highly schematic so that it represents the features of both "thick-film" solar cells and "thin-film" solar cells. Typically, solar cells that use an indirect band gap material to absorb light are typically configured as "thick-film" solar cells because a relatively thick film of the absorber layer is required to absorb a sufficient amount of light. Solar cells that use a direct band gap material to absorb light are typically configured as "thin-film" solar cells because only a thin layer of the direct band-gap material is needed to absorb a sufficient amount of light.

The arrows at the top of FIG. 6 show the source of direct solar illumination on the photovoltaic module 10. The layer 102 of the solar cells 12a, 12b is the substrate. Glass or metal is a common substrate. In some instances, there is an encapsulation layer (not shown) coating the substrate 102. In some embodiments, each solar cell 12a, 12b in the photovoltaic module 10 has its own discrete substrate 102 as illustrated in FIG. 6. In other embodiments, there is a substrate 102 that is common to all or many of the solar cells 12a, 12b of the photovoltaic module 10.

The layer 104 is the back electrical contact for each of the solar cells 12a, 12b in the photovoltaic module 10. The layer 106 is the semiconductor absorber layer of each of the solar cells 12a, 12b in the photovoltaic module 10. In a given solar cell 12a, 12b, the back electrical contact 104 makes ohmic contact with the absorber layer 106. In many but not all cases, the absorber layer 106 is a p-type semiconductor. The absorber layer 106 is thick enough to absorb light. The layer 108 is the semiconductor junction partner that, together with the semiconductor absorber layer 106, completes the formation of a p-n junction of each solar cell 12a, 12b. A p-n junction is a common type of junction found in the solar cells 12a, 12b. In p-n junction based solar cells 12a, 12b, when the semiconductor absorber layer 106 is a p-type doped material, the junction partner 108 is an n-type doped material. Conversely, when the semiconductor absorber layer 106 is an n-type doped material, the junction partner 108 is a p-type doped material. Generally, the junction partner 108 is much thinner than the absorber layer 106. The junction partner 108 is highly transparent to solar radiation. The junction partner 108 is also known as the junction partner layer, since it lets the light pass down to the absorber layer 106.

In typical thick-film solar cells 12a, 12b, the absorber layer 106 and the junction partner layer 108 can be made from the same semiconductor material but have different carrier types (dopants) and/or carrier concentrations in order to give the two layers their distinct p-type and n-type properties. In thin-film solar cells 12a, 12b in which copper-indium-gallium-diselenide (CIGS) is the absorber layer 106, the use of CdS to form the junction partner 108 has resulted in high efficiency photovoltaic devices. The layer 110 is a counter electrode that is used to draw current away from the junction since the junction partner 108 is generally too resistive to serve this function. As such, the counter electrode 110 is typically highly conductive and substantially transparent to light. The counter electrode 110 can be a comb-like structure of metal printed onto the junction partner layer 108 rather than forming a discrete layer. The counter electrode 110 is typically a transparent conductive oxide (TCO) such as doped zinc oxide. However, even when a TCO layer is present, a bus bar network 114 is typically needed in the conventional photovoltaic module 10 to draw off current since the TCO has too much resistance to efficiently perform this function in larger photovoltaic modules. The network 114 shortens the distance charge carriers must move in the TCO layer in order to reach the metal contact, thereby reducing resistive losses. The metal bus bars, also termed grid lines, can be made of any reasonably conductive metal such as, for example, silver, steel or aluminum. The metal bars are preferably configured in a comb-like arrangement to permit light rays through the TCO layer 110. The bus bar network layer 114 and the TCO layer 110, combined, act as a single metallurgical unit, functionally interfacing with a first ohmic contact to form a current collection circuit.

An optional antireflective coating 112 allows a significant amount of extra light into the solar cells 12a, 12b. Depending on the intended use of the photovoltaic module 10, it might be deposited directly on the top conductor 110 as illustrated in FIG. 6. Alternatively or additionally, the antireflective coating 112 can be deposited on a separate cover glass that overlays the top electrode 110. In some embodiments, the antireflective coating 112 reduces the reflection of the solar cells 12a, 12b to very near zero over the spectral region in which photoelectric absorption occurs, and at the same time increases the reflection in other spectral regions to reduce heating. U.S. Pat. No. 6,107,564 to Aguilera et al., hereby incorporated by reference herein in its entirety, describes representative antireflective coatings that are known in the art.

The solar cells 12a, 12b typically produce only a small voltage. For example, silicon based solar cells produce a voltage of about 0.6 volts (V). Thus, solar cells 12a, 12b are interconnected in series or parallel in order to achieve greater voltages. When connected in series, voltages of individual solar cells add together while current remains the same. Thus, solar cells arranged in series reduce the amount of current flow through such cells, compared to analogous solar cells arranged in parallel, thereby improving efficiency. As illustrated in FIG. 6, the arrangement of the solar cells 12a, 12b in series is accomplished using interconnects 116. In general, an interconnect 116 places the first electrode of one solar cell 12a in electrical communication with the counter-electrode of an adjoining solar cell 12b of a photovoltaic module 10.

Various fabrication techniques (e.g., mechanical and laser scribing) can be used to segment a photovoltaic module 10 into individual solar cells (e.g., 12a, 12b) to generate high output voltage through integration of such segmented solar cells. Grooves that separate individual solar cells typically have low series resistance and high shunt resistance to facilitate integration. Such grooves are typically made as small as possible in order to reduce dead area and enhance material usage.

Discussion or citation of a reference herein will not be construed as an admission that such reference is prior art to the present application.

SUMMARY

Under one aspect, a photovoltaic module includes a plurality of solar cells that share a common, elongated substrate. Each solar cell includes a back-electrode, a semiconductor junction disposed on and at least partially overlapping the back-electrode, and a transparent conductor disposed on and at least partially overlapping the semiconductor junction. The back-electrodes of the solar cells are physically separated and electrically isolated from each other by a groove that wraps around the substrate a plurality of times, as well as by a groove along the length of the substrate. The semiconductor junctions of the solar cells are physically separated and electrically isolated from each other by a groove that wraps around the substrate a plurality of times, and by the previously mentioned groove along the length of the substrate. The transparent conductors of the solar cells are physically separated and electrically isolated from each other by a groove that wraps around the substrate a plurality of times, as well as by the previously mentioned groove along the length of the substrate. The grooves of the back-electrodes, semiconductor junctions, and transparent conductors are laterally offset from each other. This lateral offset forms a via between the transparent conductor of a first solar cell and the back-electrode of a second solar cell that is adjacent to the first solar cell. The via is filled with transparent conductor or some other suitable conductive material. The interconnection of the transparent conductor of a cell to the back-electrode of its neighboring cell monolithically integrates the cells along the length of the substrate, thus resulting in improved performance.

Dimensions are not drawn to scale.

DETAILED DESCRIPTION

Disclosed herein are non-planar conductive devices disposed on a substrate and having boundaries defined by one or more grooves that wrap around the substrate as well as a groove that extends laterally along the substrate, methods of making same, and systems for making same. Also disclosed herein are monolithically integrated, non-planar solar cells disposed on a substrate and having boundaries defined by grooves that wrap around the substrate as well as a groove that extends laterally along the substrate, methods of making same, and systems for making same.

Scribed Non-Planar Conductive Devices

Under one aspect of the present application, a plurality of conductive devices is solar cells can be defined on an elongated substrate by a groove or scribe, where the cell or cells have boundaries that both radially wraps multiple times around the substrate, and optionally a groove or scribe along while traversing the length of the substrate.

Figure 1A:
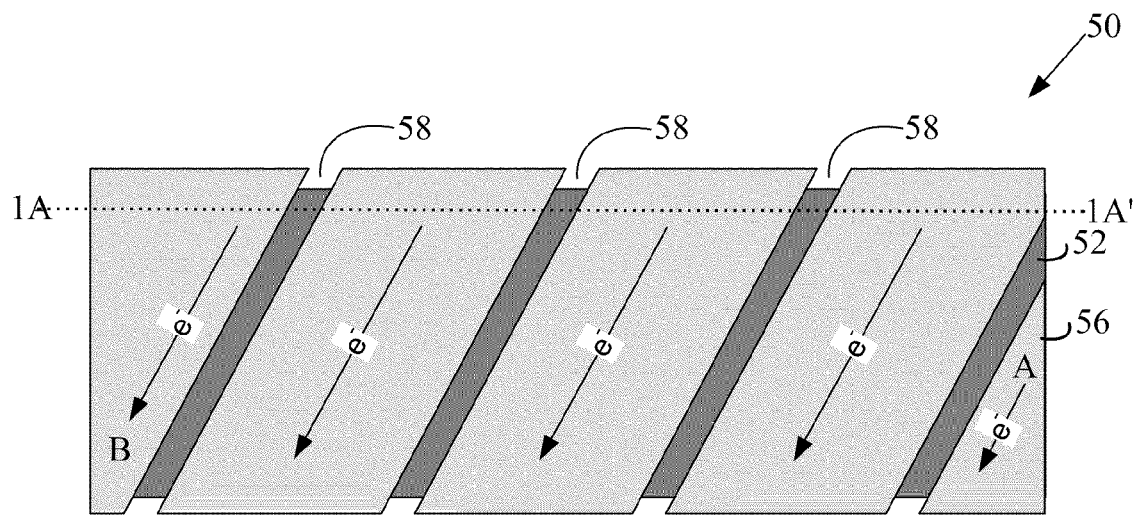
FIG. 1A illustrates a plan view of a non-planar semiconductor device in accordance with some embodiments of the present application.
Figure 1B:
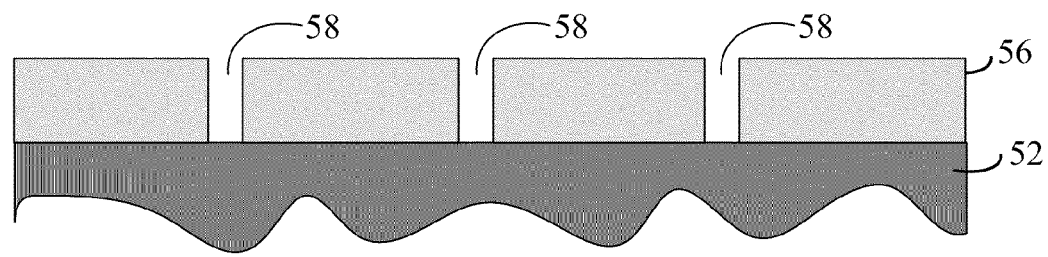
FIG. 1B illustrates a cross-sectional view of a non-planar semiconductor device in accordance with some embodiments of the present application.

FIG. 1A is a plan view of FIG. 1A is a plan view of an exemplary semiconductor unit 60 that includes a plurality of semiconductor devices 60a, 60b, 60c, 60d, and 60f. elongated conductive device 50 that includes a non-planar substrate 52, a nonplanar conductive layer 56, and a three-dimensional groove 58. The groove 58 extends through the entire thickness of semiconductor layer 56, and wraps multiple times around the substrate 52, along the length of the substrate 52. FIG. 1B is a cross-sectional view of device 50 along line 1A-1A'.

Without the groove 58, the nonplanar conductive layer 56 would conform to the entire outer surface of the substrate 52, and a current applied to the layer 56 at the first end A of the layer would simply flow straight to the other end B of the layer, resulting in a path length that is as long as the distance directly between A and B. However, the groove 58 transforms layer 56 into a single long conductor that wraps multiple times around the substrate 52. Accordingly, the groove 58 also modifies the direction in which current flows through layer 56. As illustrated in FIG. 1A, current flows from the first end A of the layer 56 to the other end B of the layer 56 via a path that wraps multiple times around the substrate. Thus, the groove 58 significantly increases the path length for current flow, which is now based on the lateral length of the layer 56 (which may be the same as the length of the substrate) and the number of times that the groove 58 traverses the perimeter of the conductive layer 56, among other things. The path length for the current flow can be modified by changing the number of times that the groove 58 wraps around the substrate.

The conductive layer 56 can include any type of conductor, including metal, semiconductor, and/or conductive or semiconductive polymer. The conductive layer need not be made of a single material, but can have some regions formed of one type of material, and other regions formed of one or more other types of material. For example, some regions of layer 56 can be metal, while other regions of layer 56 can be semiconductor or polymer. Some regions of the conductive layer 56 can even be insulative, e.g., glass or insulating polymer. The different material regions can be patterned using conventional semiconductor patterning techniques.

The nonplanar substrate 52 can include any type of suitable material, including metal, semiconductor, conductive or semiconductive polymer, and/or an insulator.

The nonplanar substrate 52 can be "omnifacial," that is, having a single surface around the perimeter of the substrate. Cylindrical substrates are an example of an omnifacial substrate. Hollow substrates (e.g., hollow tubes) are also considered to be omnifacial because the exterior surface, which is the surface upon which the semiconductor layer 56 is disposed, is omnifacial. The nonplanar substrate 52 can alternatively be "multiracial," e.g., bifacial, trifacial, or having more than three faces. A multifacial substrate has a plurality of faces that face in different directions. An example of a bifacial substrate is one having two opposing surfaces. In a multifacial configuration, the shape of the cross section of the substrate can be described by any combination of straight lines and curved features. Some examples of multifacial substrates are provided below with reference to photovoltaic devices. A "unifacial" substrate is one having only a single face that faces a single direction.

Figure 1C:
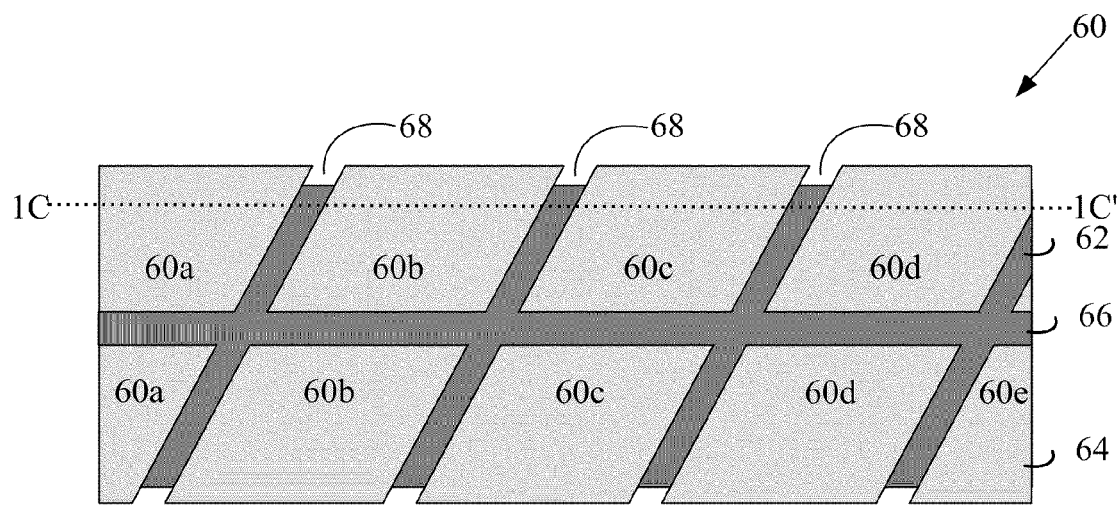
FIG. 1C illustrates a plan view of a plurality of non-planar semiconductor devices in accordance with some embodiments of the present application.
Figure 1D:
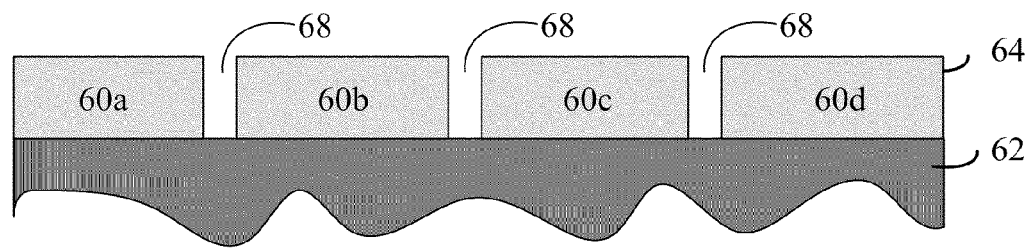
FIG. 1D illustrates a cross-sectional view of a plurality of non-planar semiconductor devices in accordance with some embodiments of the present application.

FIG. 1C is a plan view of a conductive device 60 that includes a substrate 62, a nonplanar conductive layer 64, a groove 68 that wraps multiple times around the substrate, and a groove 66 that extends along the length of the substrate. The grooves 68 and 66 both extend through the entire thickness of conductive layer 64. The grooves 68 and 66 divide the semiconductor layer into a plurality of discrete conductive devices 60a, 60b, 60c, 60d, and 60f. FIG. 1D is a cross-sectional view of device 60 along line 1C-1C'.

The size and number of conductive devices 60a, 60b, 60c, 60d into which grooves 68 and 66 divide conductive layer 64 is based, in part, on the lateral length of the layer 64 (which may be the same as the length of the substrate) and the number of times that the groove 58 traverses the perimeter of the conductive layer 64, among other things. Optionally, the device 60 can include multiple scribes 66 that extend along the length of the device, which can further divide the conductive layer 64 into additional discrete devices. The devices can be connected in series or in parallel using additional conductive material (not shown in FIG. 1C or 1D). See below for an example of connecting solar cells.

In the embodiments illustrated in FIGS. 1A-1D, a single scribed conductive layer 54 or 64 is illustrated. However, it should be noted that the devices can include multiple other layers besides the conductive layer 54 or 64. These other layers can be under the conductive layer 54 or 64, can be over the conductive layer 54 or 64, and/or can even be within the grooves. The other layers can themselves be scribed so as to have grooves. The grooves in the conductive layer 54 or 64 and any other scribed layer need not extend through the entire thickness of the layer(s), but can extend only partially through the thickness of one or more of the layer(s). The other layers can have any suitable composition (e.g., can be a conductor, insulator, or semiconductor) and can be patterned.

Nonplanar solar cells are one example of conductive devices that can be formed on nonplanar substrates. The descriptions below of methods and systems for scribing nonplanar solar cells, as well as materials and characteristics of the layers and substrates used therein, apply equally to the formation of other types of conductive devices such as those described above.

Scribed Non-Planar Solar Cells

One exemplary purpose of scribing a photovoltaic module is to break a photovoltaic module up into discrete solar cells that may, for example, be serially combined in a process known as "monolithic integration." Monolithically integrated solar cells have the useful feature of reducing current carrying requirements of the integrated solar cells. Sufficient monolithic integration can therefore substantially reduce electrode, transparent conductor, and counter-electrode current carrying requirements, thereby reducing material costs. Examples of monolithically integrated, non-planar solar cells are found in U.S. Pat. No. 7,235,736 entitled "Monolithic integration of cylindrical solar cells," which is hereby incorporated by reference herein in its entirety. The present application provides various configurations of monolithically integrated, non-planar solar cells, and systems and methods for making same.

Disclosed herein is a photovoltaic module including an elongated nonplanar substrate, and a plurality of solar cells disposed on the elongated nonplanar substrate. The electrical connections and electrical paths, and boundaries between the solar cells disposed on the elongated substrate are defined by a plurality of grooves or scribes around the module. The isolation boundaries between solar cells disposed on the elongated substrate can be defined by a groove along the length of the module. The cells are monolithically integrated with each other, e.g., adjacent cells are in serial or parallel electrical contact with each other.

Also disclosed herein is a method of forming a photovoltaic module having a nonplanar substrate that includes a non-planar back-electrode layer. The back-electrode layer is scribed so as to form a single groove that traverses a plurality of times about the substrate. A semiconductor junction is then disposed on the back-electrode layer, and is scribed so as to form a single groove that traverses a plurality of times about the substrate. A transparent conductor layer is then disposed on the semiconductor junction, and is scribed so as to form single groove that traverses a plurality of times about the substrate. The back-electrode layer, semiconductor junction, and transparent conductor layer are then scribed so as to form a single groove that traverses along the length of the substrate. This forms a plurality of solar cells, each of which includes an isolated portion of the back electrode layer, and isolated portion of the semiconductor junction, and an isolated portion of the conductor layer. The cells are monolithically integrated with each other, e.g., adjacent cells are in serial or parallel electrical contact with each other.

Also disclosed herein is a photovoltaic module including a nonplanar substrate with a nonplanar back-electrode layer disposed around the substrate, which is formed by scribing the back-electrode so as to form a single groove that traverses a plurality of times about the substrate. A semiconductor junction is then disposed on the back-electrode layer, and scribed so as to form a single groove that traverses a plurality of times about the substrate. A transparent conductor layer is then disposed on the semiconductor junction, and scribed so as to form a single groove that traverses a plurality of times about the substrate. The back-electrode layer, semiconductor junction, and transparent conductor layer are then scribed so as to form a single groove along the length of the substrate. This forms a plurality of solar cells, each of which includes an isolated portion of the back electrode layer, and isolated portion of the semiconductor junction, and an isolated portion of the conductor layer. The cells are monolithically integrated with each other, e.g., adjacent cells are in serial or parallel electrical contact with each other.

Monolithically Integrated, Non-Planar Photovoltaic Modules

Under one aspect of the present application, a monolithically integrated, non-planar photovoltaic module includes an nonplanar, elongated substrate, and a plurality of solar cells disposed on the elongated substrate, wherein boundaries between the solar cells are defined by a plurality of grooves that wrap around (or traverse) the substrate a plurality of times, a groove along the length of the substrate.

Figure 2A:
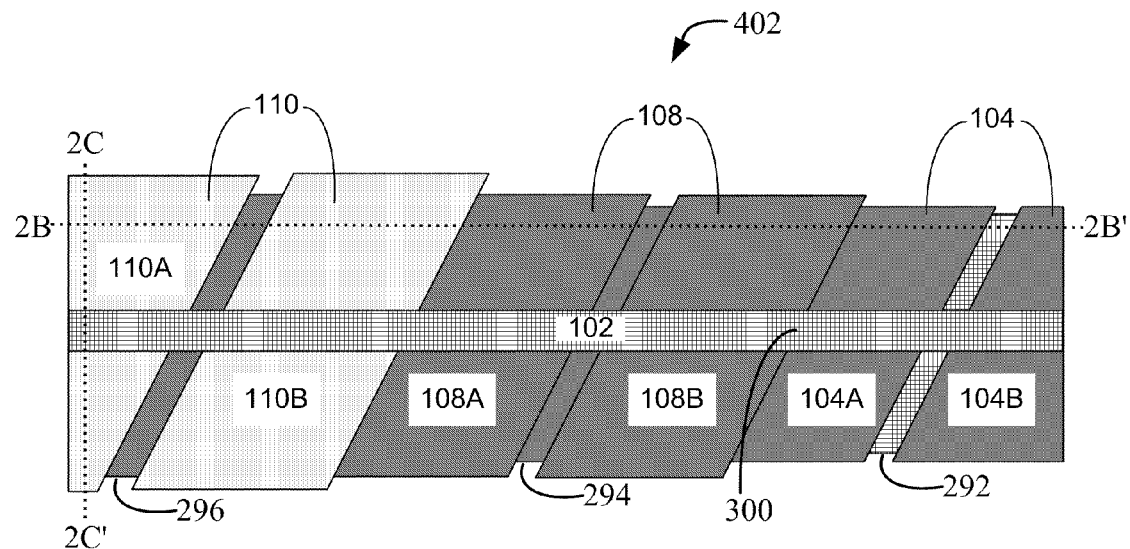
FIG. 2A illustrates a plan view of a monolithically integrated, non-planar photovoltaic module in accordance with some embodiments of the present application.

FIG. 2A illustrates a plan view of an exemplary monolithically integrated, non-planar photovoltaic module 402, with portions of some layers cut away so that various underlying features of the module can be seen more conveniently. The module 402 includes a nonplanar substrate 102, a nonplanar back-electrode 104, a nonplanar absorber layer 106 (not visible in this view), a nonplanar junction partner layer 108, and a nonplanar transparent conductor 110. Module 402 can also include one or more other layers such as those described herein, e.g., a casing, filler layer, intrinsic layer, antireflective layer, etc., but those layers are omitted in FIG. 2A for clarity. Examples of materials that can be used in module 402 are described in further detail below.

The nonplanar substrate 102 is elongated, i.e., has a length that is substantially larger than its width. In some embodiments, as illustrated in FIG. 2A, the substrate 102 is cylindrically shaped, although other nonplanar shapes are possible, as described in greater detail below. The nonplanar substrate 102 can have a solid core, as in the embodiment illustrated in FIG. 2A, while in other embodiments, the elongated substrate 102 can have a hollow core.

The nonplanar back-electrode 104 is disposed on the substrate 102, and is divided into discrete portions (e.g., the portions 104A and 104B) by a groove 292 that wraps a plurality of times about the substrate 102 and the groove 300 along the length of the substrate 102. In the illustrated embodiment, groove 292 is helical (i.e., is a straight line that wraps around the circumference of substrate 102), and groove 300 is linear, although other shapes are possible, as described in greater detail below. The grooves 292 and 300 each extend through the entire thickness of the back electrode layer 104, in defined regions. As described in greater detail below, the linear groove 300 also extends through the entire thicknesses of the absorber layer (not visible in this view), the junction partner layer 108, and the overlying transparent conductor layer 110.

The grooves 292, 300 physically separate and electrically isolate the portions 104A, 104B of the back-electrode 104 from each other. In some embodiments, a groove is considered to be "electrically isolating" when the resistance across the groove (e.g., from a first side of the groove to a second side of the groove) is 10 ohms or more, 20 ohms or more, 50 ohms or more, 1000 ohms or more, 10,000 ohms or more, 100,000 ohms or more, $1\times10^6$ ohms or more, $1\times10^7$ ohms or more, $1\times10^8$ ohms or more, $1\times10^9$ ohms or more, or $1\times10^{10}$ ohms or more. The electrical resistance between adjacent portions of the back-electrode 104 (e.g., the portions 104A, 104B) is based, among other things, on the width, depth, and quality of the grooves 292, 300. Note that although grooves may electrically isolate portions of a given layer from each other, one or more materials subsequently deposited within those grooves may provide some electrical contact between those portions. Even if other materials are present in a groove, the portions of a given layer (e.g., the portions 104A, 104B) are still considered to be physically separated and electrically isolated from each other by that groove.

Although other portions of back-electrode 104 are not visible in this view because they are obscured by overlying layers (e.g., the layers 108 and 110), the grooves 292, 300 define multiple discrete portions of the back-electrode 104 along the length of the nonplanar substrate 102. In embodiments in which groove 292 is helical, the number and size of portions into which the back-electrode is divided is based on, among other things, the length and cross-sectional dimensions of the nonplanar substrate 102, and the pitch of the helical groove 292. The "pitch" of a helix is defined to be the width of one complete helix turn (e.g., about the substrate 102), measured along the helix axis (e.g., along the length of the substrate).

A nonplanar semiconductor junction that includes an absorber layer 106 (not visible in this view) disposed on the back-electrode 104, and a junction partner layer 108 disposed on the absorber layer 106, is divided into discrete portions (106A, 106B, 108A, 108B) by the groove 294 about the circumference along the length of the substrate 102 and the groove 300 along the length of the substrate 102. Although FIG. 2A illustrates groove 294 as helical, other shapes are possible, as described below. The grooves 294 and 300 each extend through the entire thicknesses of the junction partner layer 108 and the absorber layer 106.

The groove 294 of the absorber and the junction partner layers 106, 108 is laterally offset from the groove 292 of the back-electrode layer 104, and in some embodiments, has substantially the same pitch as the groove 292. Although other portions of the absorber layer 106 and the junction partner layer 108 are not visible in this view because they are obscured by overlying layers, the grooves 294, 300 define multiple discrete portions of the absorber layer 106 and the junction partner layer 108 along the length of the substrate 102. Additionally, although the portions 104A and 104B of the back-electrode layer 104 are at least partially visible in the view of FIG. 2A, in some embodiments the portions 104A and 104B would be at least partially obscured by overlying the absorber layer 106 and the junction partner layer 108, as well as other layers present in the photovoltaic module 402.

The grooves 294, 300 electrically isolate the portions 106A, 106B (not visible in this view) of absorber layer 106 from each other, and electrically isolate the portions 108A, 108B of junction partner layer 108 from each other. In embodiments where the groove 294 is helical, the number of portions into which the absorber and junction partner layers are divided is based on, among other things, the length and cross-sectional dimensions of the substrate 102, and the pitch of the helical groove 294. The electrical resistance between adjacent portions of the absorber layer (e.g., portions 106A, 106B), and the electrical resistance between adjacent portions of the junction partner layer (e.g., portions 108A, 108B) is based on, among other things, the width, depth, and quality of the grooves 294, 300.

A nonplanar transparent conductor layer 110 is disposed on the junction partner layer 108, and is divided into discrete portions (110A, 110B) by a groove 296 about the substrate 102 and the groove 300 along the length of the substrate. The groove 296 of the transparent conductor layer 110 is laterally offset from the groove 294 of the absorber and junction partner layers 106, 108, and is also laterally offset from the groove 292 of the back-electrode layer 104. In some embodiments, for example, in some embodiments where grooves 292, 294, and 296 are helical, the groove 296 has substantially the same pitch as the grooves 292 and/or 294. The grooves 296 and 300 each extend through the entire thickness of the transparent conductor layer 110.

Although other portions of the nonplanar transparent conductor layer 110 are not visible in this view because they are obscured by overlying layers, the grooves 296, 300 define multiple discrete portions of the transparent conductor layer 110 along the length of the substrate 102. Additionally, although the portions 104A and 104B of the back-electrode layer 104 and the portions 108A and 108B of the junction partner layer 108 are at least partially visible in the view of FIG. 3A, in some embodiments the portions 104A, 104B, 108A, and 108B are at least partially obscured by the transparent conductor layer 110, in combination with one or more other layers present in the photovoltaic module 402. In the embodiment illustrated in FIG. 3A, a small portion of the layer 108 can be seen through the helical gap 296 between the portions 110A, 110B of the transparent conductor layer 110.

The grooves 296, 300 electrically isolate the portions 110A, 110B of the transparent conductor layer 110 from each other. In embodiments in which groove 296 is helical, the number of portions into which the transparent conductor layer 110 divided is based on, among other things, the length and cross-sectional dimensions of the substrate 102, and the pitch of helical groove 296. The electrical resistance between adjacent portions of the transparent conductor layer (e.g., the portions 110A, 110B) is based on, among other things, the width, depth, and quality of the grooves 296, 300.

Figure 2B:
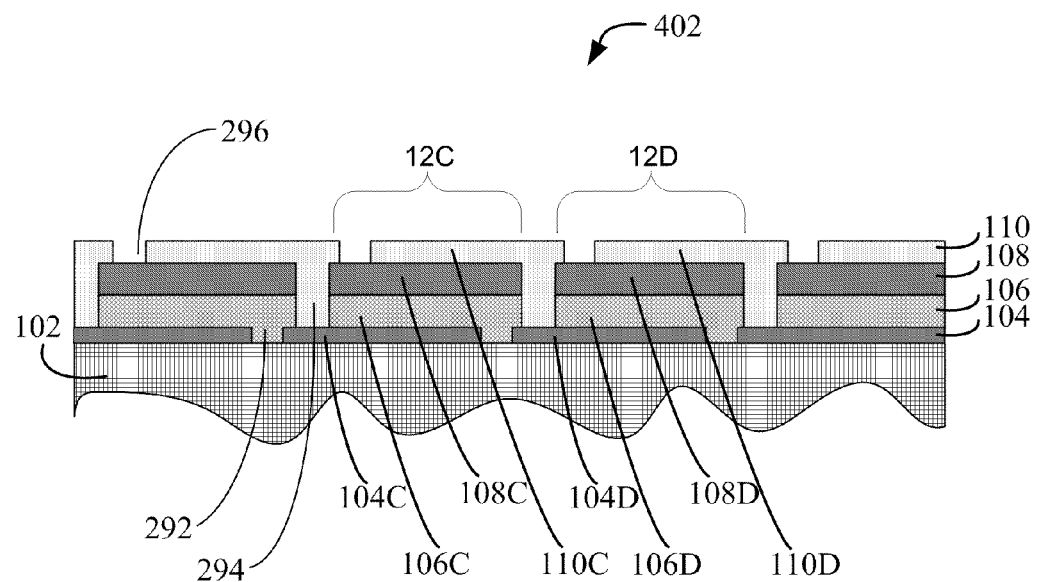
FIG. 2B illustrates a cross-sectional view of a monolithically integrated, non-planar photovoltaic module in accordance with some embodiments of the present application.

FIG. 2B illustrates a cross-section of the non-planar photovoltaic module 402 illustrated in FIG. 2A, taken along line 2B-2B'. The photovoltaic module 402 includes a first solar cell 12C and a second solar cell 12D that is adjacent to, and shares nonplanar substrate 102 with, a second solar cell 12D. As mentioned above, although nonplanar substrate 102 is cylindrical in the illustrated embodiment, the substrate can have alternate nonplanar shapes, as described in greater detail below.

The solar cell 12C includes a back-electrode portion 104C, an absorber layer portion 106C, a junction partner layer portion 108C, and a transparent conductor portion 110C. The solar cell 12D includes a back-electrode portion 104D, an absorber layer portion 106D, a junction partner layer portion 108D, and a transparent conductor portion 110D. The groove 292 separates the back-electrode portion 104C of the first solar cell 12C from the back-electrode portion 104D of the second solar cell 12D. The groove 294 respectively separates the absorber layer portion 106C and the junction partner layer portion 108C of the first solar cell 12C from the absorber layer portion 106D and the junction partner layer portion 108D of the second solar cell 12D. The groove 296 separates the transparent conductor portion 110C of the first solar cell 12C from the transparent conductor portion 110D of the second solar cell 12D. In some embodiments, the widths of solar cells 12C, 12D is between about 1 millimeter (mm) and about 20 mm, e.g., about 6 mm.

The solar cells 12C and 12D are monolithically integrated with each other, as well as with respective adjacent solar cells. In the illustrated embodiment, the transparent conductor portion 110C of the first solar cell 12C is in serial electrical communication with the back-electrode portion 104D of the second solar cell 12D. In the embodiments illustrated in FIGS. 2A-2F, the transparent conductor portion 110C of the first solar cell 12C fills the groove 294 and contacts the back electrode portion 104D of the second solar cell 12D, thus providing an electrical communication pathway between the transparent conductor portion 110C and the back electrode portion 104D. In operation, current flows between transparent conductor portion 110C and back electrode portion 104D via the transparent conductor material within the groove 294. Thus, the portion of transparent conductor within groove 294 can be considered a "conductive via." In other embodiments, a conductive material other than transparent conductor is provided within groove 294 to provide electrical communication between the transparent conductor portion 110C and the back-electrode portion 104D, e.g., a metal or alloy. In some embodiments, the solar cells 12C and 12D are in parallel electrical contact with each other.

Note that although the transparent conductor material within the groove 294 provides electrical communication between the absorber layer portion 106C and the junction partner layer portion 108C of the first solar cell 12C, and the absorber layer portion 106D and the junction partner layer portion 108D of the second solar cell 12D, in operation, there is a negligible potential difference and thus negligible current flow between the absorber layer portion 106C and the junction partner layer portion 108C of the first solar cell 12C, and the absorber layer portion 106D and the junction partner layer portion 108D of the solar cell 12D. The predominant current flow between the first and second solar cells 12C and 12D is between the transparent conductor portion 110C and the back-electrode portion 104D through the transparent conductor (or other conductive material) within the groove 294.

Figure 2C:
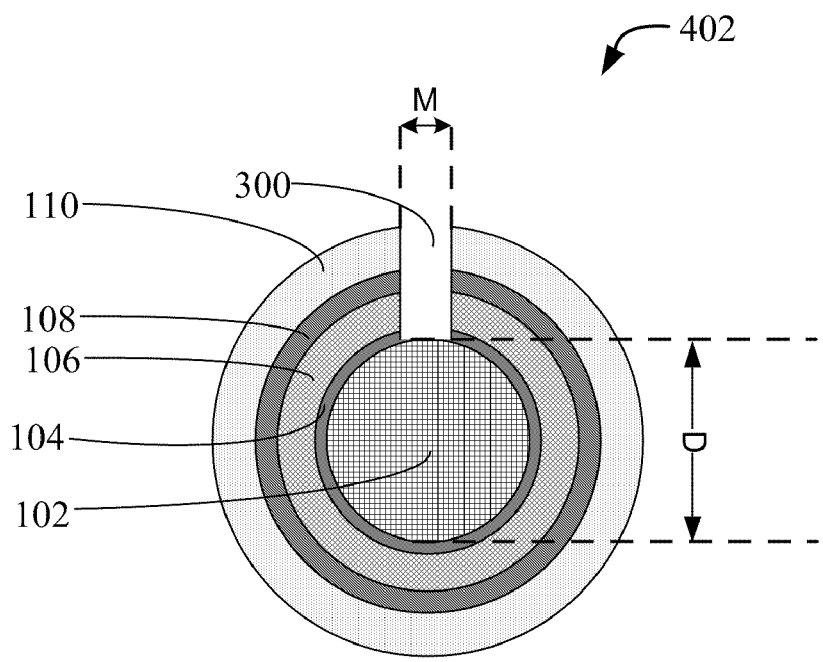
FIG. 2C illustrates a cross-sectional view of a monolithically integrated, non-planar photovoltaic module in accordance with some embodiments of the present application.

FIG. 2C illustrates a cross-section of the photovoltaic module 402 illustrated in FIG. 2A, taken along line 2C-2C'. As described above with respect to FIGS. 2A and 2B, the photovoltaic module 402 includes a substrate 102, a back-electrode 104, an absorber layer 106, a junction partner layer 108, and a transparent conductor layer 110. A groove 300 extends through the thicknesses of each of the layers 104, 106, 108, and 110, and in combination with the grooves 292, 294, and 296 (not visible in this view) divides the layers 104, 106, 108, and 110 into discrete portions that are respectively electrically isolated from each other. The size and shape of the solar cells in the module 402 is based in part on the diameter D of the substrate 102, as well as the widths and pitches of the grooves 292, 294, and 296, and the width M of the groove 300.

Figure 2D:
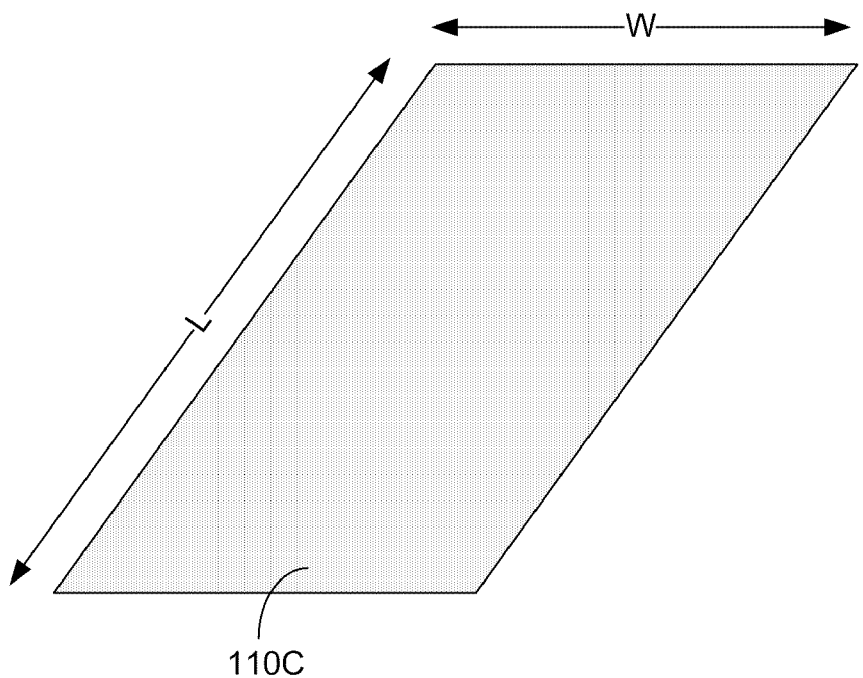
FIG. 2D illustrates a plan view of a non-planar solar cell in accordance with some embodiments of the present application.

FIG. 2D illustrates a plan view of an individual transparent conductor layer portion 110C of solar cell 12C of the nonplanar photovoltaic module 402 illustrated in FIG. 2B, in a "planarized" perspective representing what it would look like if the portion 110C was peeled from the solar cell 12C and laid flat on a planar surface. The "planarized" transparent conductor layer portion 110C has the shape of a parallelogram, where the top and bottom edges of the parallelogram are defined by the groove 300, and the side edges of the parallelogram are defined by the groove 296. In the illustrated embodiment, groove 296 is helical, and the top and bottom edges of the parallelogram have a width W that is based on the pitch and width of the helical groove 296. The side edges of the parallelogram have a length L that is based on the pitch of the groove 296, the diameter D of the substrate, and the width W of the groove 300.

If also "planarized," the back-conductor layer portion 104C of the solar cell 12C (not shown in FIG. 2D) would also have the shape of a parallelogram, where the top and bottom edges of the parallelogram have a width W that is based on the pitch and width of the groove 292, and where the side edges of the parallelogram have a length L that is based on the pitch of the groove 292, the diameter D of the substrate, and the width W of the groove 300.

If also "planarized," the absorber layer portion 106C and the junction partner layer portion 108C of the solar cell 12C (not shown in FIG. 2D) would also have the shape of a parallelogram, where the top and bottom edges of the parallelogram have a width W that is based on the pitch and width of the groove 294, and where the side edges of the parallelogram have a length L that is based on the pitch of the groove 294, the diameter D of the substrate, and the width W of the groove 300.

In other embodiments, e.g., in which groove 296 is not helical and/or groove 300 is not linear, the solar cells 12C and 12D may have the same or different shapes as each other, and will have surface areas that are defined by the particular embodiments of grooves 296 and 300.

Figure 2E:
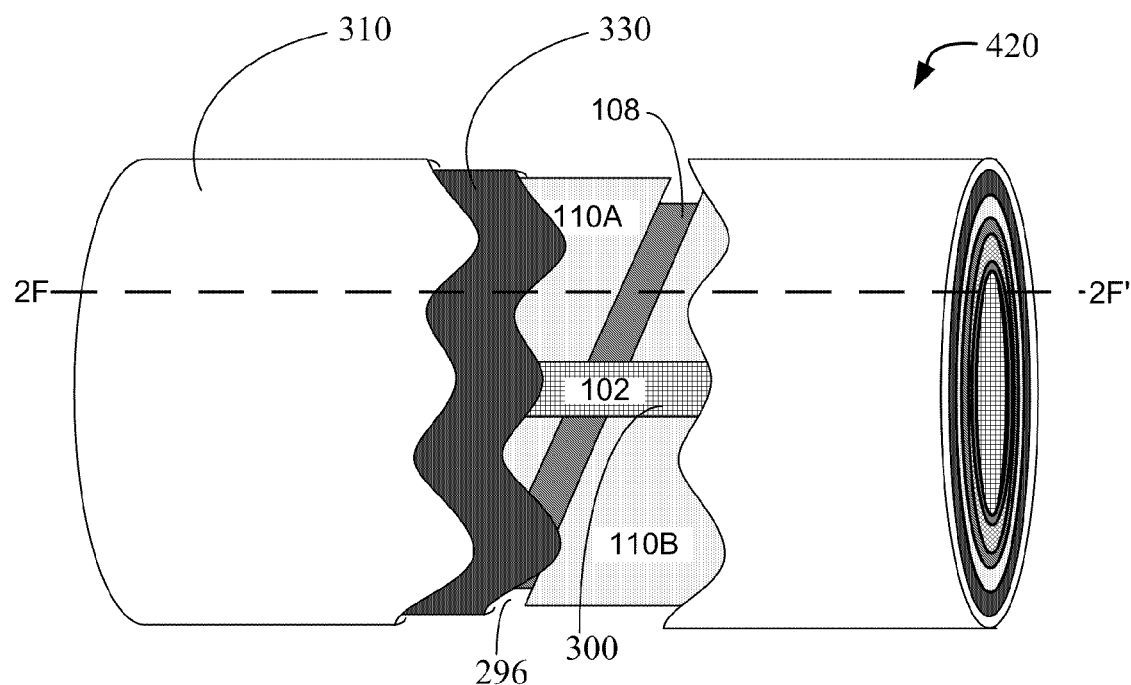
FIG. 2E illustrates a perspective view of an encased, monolithically integrated, non-planar photovoltaic module in accordance with some embodiments of the present application.

As illustrated in the perspective view of FIG. 2E, the photovoltaic module 420 can optionally include a substantially transparent casing 310 and filler 330. The casing 310 can help to protect the solar cells of the module from damage, and the filler 330 substantially fills the space between the casing 310 and the solar cells 12. In FIG. 2E, portions of the filler 330 and the casing 310 are "cut away" so that portions of the underlying substrate 102 (visible through the groove 300), the junction partner layer 108 (visible through the groove 296), and the transparent conductor layer portions 110A, 110B can be seen.

Figure 2F:
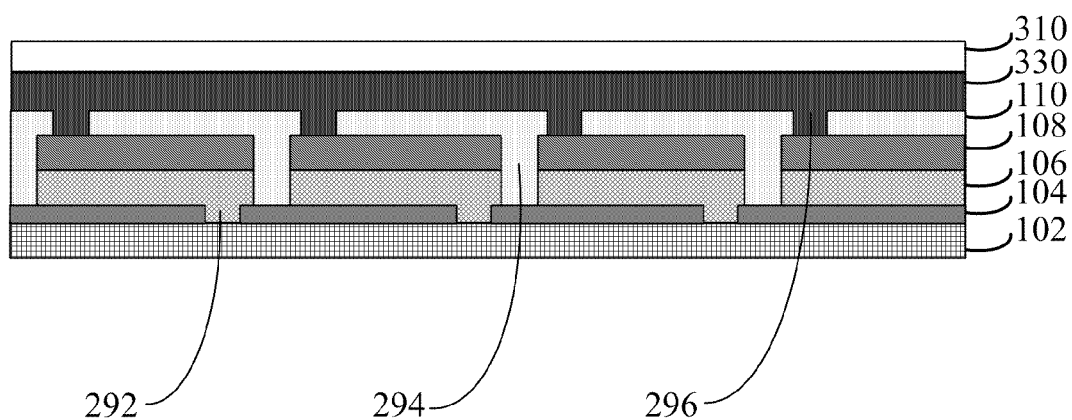
FIG. 2F illustrates a cross-sectional view of an encased, monolithically integrated, non-planar photovoltaic module in accordance with some embodiments of the present application.

FIG. 2F is a cross-sectional view of the embodiment of FIG. 2E taken along lines 2F-2F'. The filler 330 is disposed on the transparent conductor layer 110, and the casing is disposed on the filler 330. The filler also fills the groove 296 in the transparent conductor layer 110, and contacts portions of the junction partner layer 108. The casing 310 need not be cylindrical.

As noted above, the grooves 292, 294, and 296 need not be helical (a line wrapped around the substrate). Instead, the grooves 292, 294, and 296 can take a variety of shapes. For example, the grooves, independently of each other, can have a repeating pattern (e.g., a curve, a wavy line, or a zig-zag) or can have a non-repeating pattern. In some embodiments, one or more of the grooves 292, 294, and 296 is a space curve, wherein the space curve is formed by wrapping a two dimensional curve having a repeating pattern about the photovoltaic module.

In some embodiments, the grooves 292, 294, and 296 have approximately the same repeating or non-repeating pattern as each other, so that adjacent solar cells will have approximately the same shape as each other. The groove 300 need not be linear, but can have a repeating pattern (e.g., a curve, a wavy line, or a zig-zag), or can have a non-repeating pattern. Additionally, adjacent solar cells need not have the same shape or surface area as one another. For example, solar cells at the end of the nonplanar photovoltaic module may have a truncated surface area relative to solar cells central to the nonplanar photovoltaic module. In other embodiments, some or all of the solar cells in the nonplanar photovoltaic module will have the same surface area as each other.

Methods of Forming Monolithically Integrated, Non-Planar Photovoltaic Modules

Figure 3:
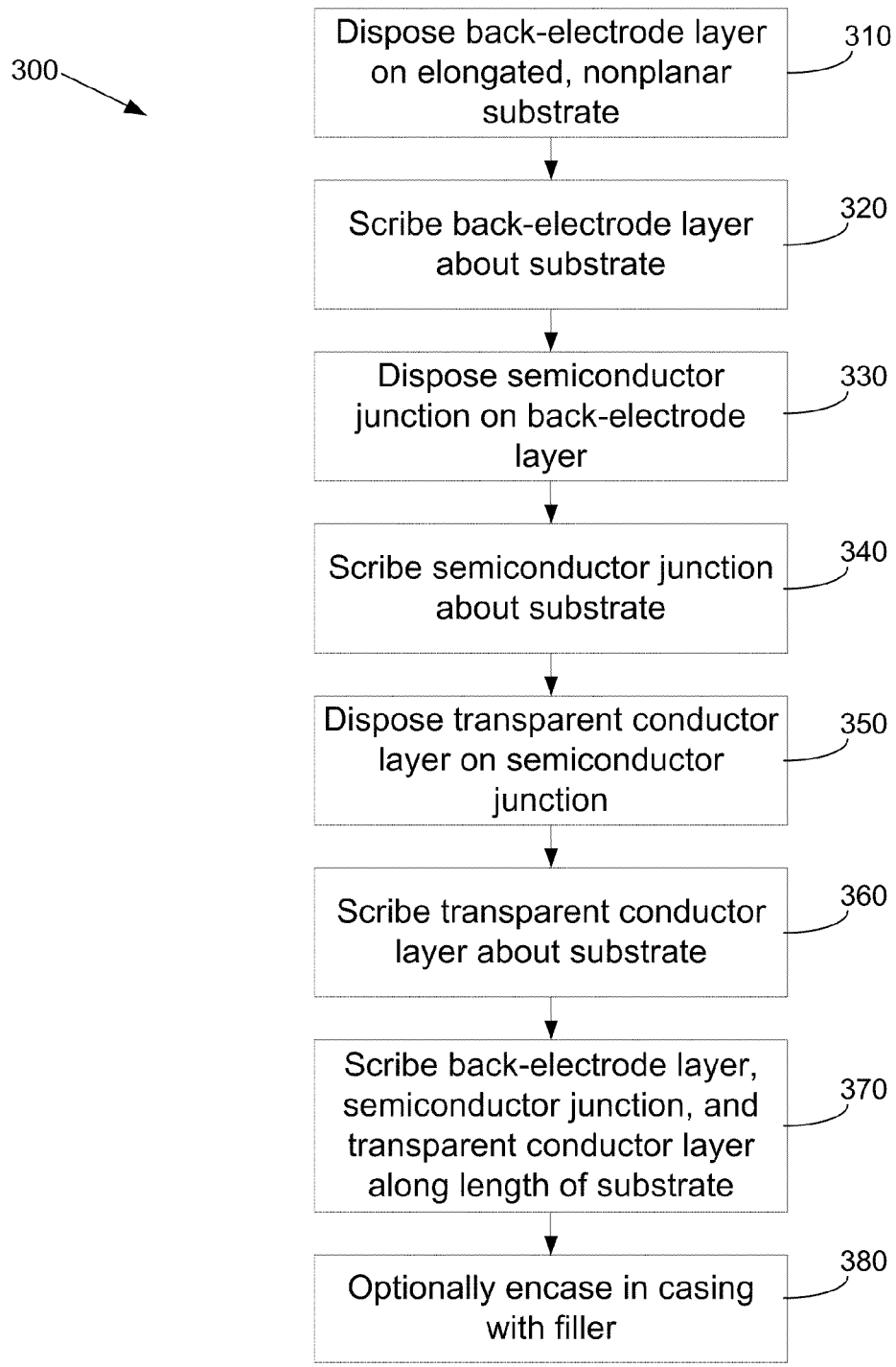
FIG. 3 illustrates a method for forming a monolithically integrated, non-planar solar cell module in accordance with some embodiments of the present application.

FIG. 3 illustrates an overview of a method 300 of forming monolithically integrated, non-planar photovoltaic modules, e.g., module 402 illustrated in FIGS. 2A-2F, according to some embodiments of the present application. The individual steps in the method, and structures formed during same, are described in greater detail below with respect to FIGS. 4A-4I.

First, a back-electrode layer is disposed around an elongated substrate (310). The substrate can be cylindrical, or some other nonplanar shape (more below). The back-electrode layer is deposited by any one of numerous methods, e.g., sputtering, physical vapor deposition, or other suitable techniques, and as described in greater detail below.

The back-electrode layer is then scribed about the substrate (320). The scribing forms a single groove through the thickness of the back electrode layer that traverses a perimeter of the back electrode layer a plurality of times (wraps around the substrate a plurality of times). In some embodiments, the back-electrode layer is scribed with a laser scriber or with a mechanical scriber, e.g., a constant-force mechanical scriber such as that disclosed in U.S. Patent Application No. 60/980,372, entitled "Constant Force Mechanical Scribers and Methods for Using Same in Semiconductor Processing Applications," the entire contents of which are incorporated by reference herein. Further details of scribing are described in greater detail below.

A semiconductor junction is then disposed on the back-electrode layer (330). Some portions of the semiconductor junction fill the groove that was previously scribed into the back-electrode layer, thereby contacting the substrate. In some embodiments, the semiconductor junction includes an absorber layer and a junction partner layer, as described in greater detail below.

The semiconductor junction is then scribed about the substrate (340). The scribing forms a single groove through the thickness of the semiconductor junction, along the length of the substrate. The groove in the semiconductor junction is laterally offset from the groove of the back-electrode formed at 320. In some embodiments, the semiconductor junction is scribed with a laser scriber or with a mechanical scriber.

A transparent conductor layer is then disposed on the semiconductor junction (350). Some portions of the transparent conductor layer fill the groove that was previously scribed into the semiconductor junction, thereby contacting the back-electrode.

The transparent conductor layer is then scribed about the substrate (360). The scribing forms a single groove through the thickness of the transparent conductor layer, along the length of the substrate. The groove in the transparent conductor layer is laterally offset from the groove of the back-electrode formed at 320 and the groove of the semiconductor junction formed at 340. In some embodiments, the semiconductor junction is scribed with a laser scriber or with a mechanical scriber.

The back-electrode layer, semiconductor junction, and transparent conductor layer are then scribed along the length of the substrate (370). The scribing defines a single groove throughout the thicknesses of the back-electrode layer, semiconductor junction, and transparent conductor layer along the length of the substrate. The groove formed in 370, along with the grooves formed at 320, 340, and 360, defines a plurality of solar cells, each of which includes an isolated portion of the back-electrode layer, an isolated portion of the semiconductor junction, and an isolated portion of the transparent conductor layer. In some embodiments, the groove is linear, while in other embodiments the groove has a repeating or non-repeating pattern. In some embodiments, the back-electrode layer, semiconductor junction, and transparent conductor layer are scribed with a laser scriber or with a mechanical scriber.

Optionally, the photovoltaic module is then encased in a substantially transparent casing with filler (380).

The steps of method 300, and structures formed during same, will now be discussed in greater detail with reference to FIGS. 4A-4I. However, the methods of forming a photovoltaic module 402 are not limited to the steps shown in FIGS. 3 and 4A to 4I. Modifications and variations are contemplated.

Figure 4A:
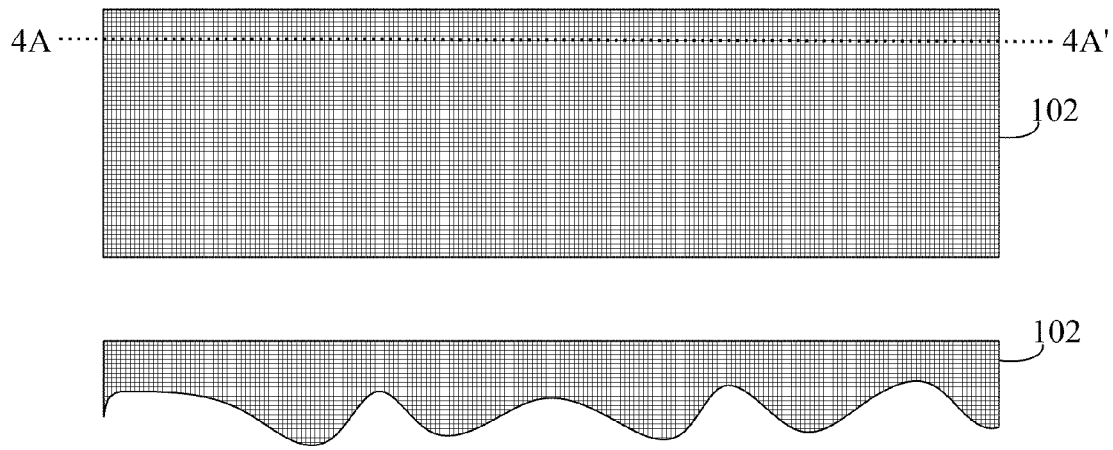
FIGS. 4A-4I illustrate plan and cross-sectional views of structures formed during a method for forming monolithically integrated solar cells of a photovoltaic module in accordance with some embodiments of the present application.

Elongated, Nonplanar Substrate. FIG. 4A illustrates a plan view and a cross-sectional view along line 4A-4A' of an elongated, nonplanar substrate 102 upon with a plurality of solar cells is to be formed, e.g., using the method 300 illustrated in FIG. 3. The substrate 102 illustrated in FIG. 4A has a cylindrical shape, but non-planar substrates are not limited to being cylindrical in shape. In some embodiments, the substrate 102 has a non-planar shape (more below). In some embodiments, the substrate 102 is rigid.

In some embodiments, the elongated substrate 102 is made of a plastic, metal, metal alloy, or glass, and can be solid (e.g., a rod) or hollowed (e.g., a tube). As used herein, the term "tubular" means objects having a tubular or approximately tubular shape. In fact, tubular objects can have irregular shapes so long as the object, taken as a whole, is roughly tubular.

In some embodiments, the substrate 102 is optically transparent to wavelengths that are generally absorbed by the semiconductor junction of a solar cell of the photovoltaic module, while in other embodiments, the substrate 102 is not optically transparent.

In some embodiments, the elongated substrate 102 of FIG. 2A is made of a plastic, metal, metal alloy, glass, glass fibers, glass tubing, or glass tubing. In some embodiments, the elongated substrate 102 is made of a urethane polymer, an acrylic polymer, a fluoropolymer, polybenzamidazole, polyimide, polytetrafluoroethylene, polyetheretherketone, polyamide-imide, glass-based phenolic, polystyrene, cross-linked polystyrene, polyester, polycarbonate, polyethylene, polyethylene, acrylonitrile-butadiene-styrene, polytetrafluoroethylene, polymethacrylate, nylon 6,6, cellulose acetate butyrate, cellulose acetate, rigid vinyl, plasticized vinyl, or polypropylene. In some embodiments, substrate 102 is made of aluminosilicate glass, borosilicate glass (e.g., PYREX, DURAN, SIMAX, etc.), dichroic glass, germanium/semiconductor glass, glass ceramic, silicate/fused silica glass, soda lime glass, quartz glass, chalcogenide/sulphide glass, fluoride glass, pyrex glass, a glass-based phenolic, cereated glass, or flint glass.

In some embodiments, the elongated substrate 102 is made of a material such as polybenzamidazole (e.g., CELAZOLE®, available from Boedeker Plastics, Inc., Shiner, Tex.). In some embodiments, substrate 102 is made of polyimide (e.g., DUPONT™ VESPEL®, or DUPONT™ KAPTON®, Wilmington, Del.). In some embodiments, the elongated substrate 102 is made of polytetrafluoroethylene (PTFE) or polyetheretherketone (PEEK), each of which is available from Boedeker Plastics, Inc. In some embodiments, the elongated substrate 102 is made of polyamide-imide (e.g., TORLON® PAI, Solvay Advanced Polymers, Alpharetta, Ga.).

In some embodiments, the elongated substrate 102 is made of a glass-based phenolic. Phenolic laminates are made by applying heat and pressure to layers of paper, canvas, linen or glass cloth impregnated with synthetic thermosetting resins. When heat and pressure are applied to the layers, a chemical reaction (polymerization) transforms the separate layers into a single laminated material with a "set" shape that cannot be softened again. Therefore, these materials are called "thermosets." A variety of resin types and cloth materials can be used to manufacture thermoset laminates with a range of mechanical, thermal, and electrical properties. In some embodiments, the elongated substrate 102 is a phenoloic laminate having a NEMA grade of G-3, G-5, G-7, G-9, G-10 or G-11. Exemplary phenolic laminates are available from Boedeker Plastics, Inc.

In some embodiments, the substrate 102 is made of polystyrene. Examples of polystyrene include general purpose polystyrene and high impact polystyrene as detailed in Marks' *Standard Handbook for Mechanical Engineers*, ninth edition, 1987, McGraw-Hill, Inc., p. 6-174, which is hereby incorporated by reference herein in its entirety. In still other embodiments, the elongated substrate 102 is made of cross-linked polystyrene. One example of cross-linked polystyrene is REXOLITE® (C-Lec Plastics, Inc). REXOLITE is a thermoset, in particular a rigid and translucent plastic produced by cross linking polystyrene with divinylbenzene.

In some embodiments, the elongated substrate 102 is a polyester wire (e.g., a MYLAR® wire). MYLAR® is available from DuPont Teijin Films (Wilmington, Del.). In still other embodiments, the elongated substrate 102 is made of DURASTONE®, which is made by using polyester, vinylester, epoxid and modified epoxy resins combined with glass fibers (Roechling Engineering Plastic Pte Ltd., Singapore).

In still other embodiments, the elongated substrate 102 is made of polycarbonate. Such polycarbonates can have varying amounts of glass fibers (e.g., 10% or more, 20% or more, 30% or more, or 40% or more) in order to adjust tensile strength, stiffness, compressive strength, as well as the thermal expansion coefficient of the material. Exemplary polycarbonates are ZELUX® M and ZELUX® W, which are available from Boedeker Plastics, Inc.

In some embodiments, the elongated substrate 102 is made of polyethylene. In some embodiments, the elongated substrate 102 is made of low density polyethylene (LDPE), high density polyethylene (HDPE), or ultra high molecular weight polyethylene (UHMW PE). Chemical properties of HDPE are described in Marks' *Standard Handbook for Mechanical Engineers*, ninth edition, 1987, McGraw-Hill, Inc., p. 6-173, which is hereby incorporated by reference herein in its entirety. In some embodiments, the elongated substrate 102 is made of acrylonitrile-butadiene-styrene, polytetrfluoro-ethylene (TEFLON), polymethacrylate (lucite or plexiglass), nylon 6,6, cellulose acetate butyrate, cellulose acetate, rigid vinyl, plasticized vinyl, or polypropylene. Chemical properties of these materials are described in Marks' *Standard Handbook for Mechanical Engineers*, ninth edition, 1987, McGraw-Hill, Inc., pp. 6-172 through 6-175, which is hereby incorporated by reference herein in its entirety.

Additional exemplary materials that can be used to form the elongated substrate 102 are found in *Modern Plastics Encyclopedia*, McGraw-Hill; Reinhold Plastics Applications Series, Reinhold Roff, *Fibres, Plastics and Rubbers*, Butterworth; Lee and Neville, *Epoxy Resins*, McGraw-Hill; Bilmetyer, *Textbook of Polymer Science*, Interscience; Schmidt and Marlies, *Principles of high polymer theory and practice*, McGraw-Hill; Beadle (ed.), *Plastics*, Morgan-Grampiand, Ltd., 2 vols. 1970; Tobolsky and Mark (eds.), *Polymer Sci-

*ence and Materials*, Wiley, 1971; Glanville, *The Plastics's Engineer's Data Book*, Industrial Press, 1971; Mohr (editor and senior author), Oleesky, Shook, and Meyers, *SPI Handbook of Technology and Engineering of Reinforced Plastics Composites*, Van Nostrand Reinhold, 1973, each of which is hereby incorporated by reference herein in its entirety.

In some embodiments, a cross-section of the elongated substrate 102 is cylindrical and has an outer diameter of between 3 mm and 100 mm, between 4 mm and 75 mm, between 5 mm and 50 mm, between 10 mm and 40 mm, or between 14 mm and 17 mm. In some embodiments, a cross-section of the elongated substrate 102 is circumferential and has an outer diameter of between 1 mm and 1000 mm.

In some embodiments, the elongated substrate 102 is a tube with a hollowed inner portion. In such embodiments, a cross-section of the elongated substrate 102 is characterized by an inner radius defining the hollowed interior and an outer radius. The difference between the inner radius and the outer radius is the thickness of the elongated substrate 102. In some embodiments, the thickness of the elongated substrate 102 is between 0.1 mm and 20 mm, between 0.3 mm and 10 mm, between 0.5 mm and 5 mm, or between 1 mm and 2 mm. In some embodiments, the inner radius is between 1 mm and 100 mm, between 3 mm and 50 mm, or between 5 mm and 10 mm.

In some embodiments, the elongated substrate 102 has a length (perpendicular to the plane defined by FIG. 3B) that is between 5 mm and 10,000 mm, between 50 mm and 5,000 mm, between 100 mm and 3000 mm, or between 500 mm and 1500 mm. In one embodiment, the elongated substrate 102 is a hollowed tube having an outer diameter of 15 mm and a thickness of 1.2 mm, and a length of 1040 mm.

In some embodiments, the elongated substrate 102 has a width dimension and a longitudinal dimension. In some embodiments, the longitudinal dimension of the elongated substrate 102 is at least four times greater than the width dimension. In other embodiments, the longitudinal dimension of the elongated substrate 102 is at least five times greater than the width dimension. In yet other embodiments, the longitudinal dimension of the elongated substrate 102 is at least six times greater than the width dimension. In some embodiments, the longitudinal dimension of the elongated substrate 102 is 10 cm or greater. In other embodiments, the longitudinal dimension of the elongated substrate 102 is 50 cm or greater. In some embodiments, the width dimension of the elongated substrate 102 is 1 cm or greater. In other embodiments, the width dimension of the elongated substrate 102 is 5 cm or greater. In yet other embodiments, the width dimension of the elongated substrate 102 is 10 cm or greater.

Figure 4B:
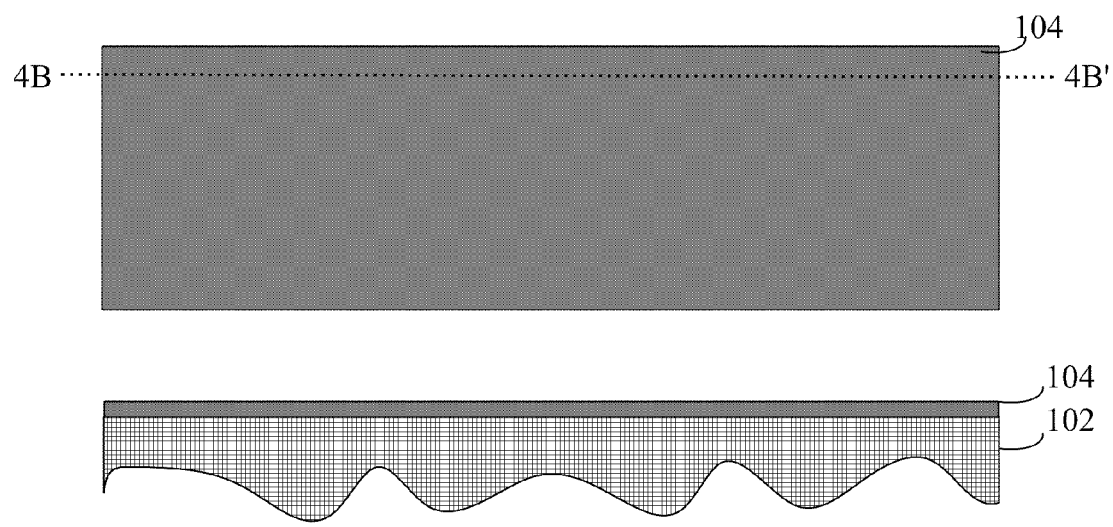

Disposing The Back-Electrode (310). FIG. 4B illustrates a plan view and a cross-sectional view along line 4B-4B' of a structure formed after disposing a back-electrode 104 on an elongated non-planar substrate 102 (step 310 of FIG. 3). Techniques for disposing a back-electrode on a substrate are known in the art and any such techniques can be used.

In some embodiments, the back-electrode 104 is made out of any material that can support the photovoltaic current generated by a solar cell with negligible resistive losses. In some embodiments, the back-electrode 104 is composed of any suitable conductive material, such as aluminum, molybdenum, tungsten, vanadium, rhodium, niobium, chromium, tantalum, titanium, steel, nickel, platinum, silver, gold, an alloy thereof (e.g. Kovar), or any combination thereof. In some embodiments, the back-electrode 104 is composed of any suitable conductive material, such as indium tin oxide, titanium nitride, tin oxide, fluorine doped tin oxide, doped zinc oxide, aluminum doped zinc oxide, gallium doped zinc oxide, boron dope zinc oxide indium-zinc oxide, a metal-carbon black-filled oxide, a graphite-carbon black-filled oxide, a carbon black-carbon black-filled oxide, a superconductive carbon black-filled oxide, an epoxy, a conductive glass, or a conductive plastic. A conductive plastic is one that, through compounding techniques, contains conductive fillers which, in turn, impart their conductive properties to the plastic. In some embodiments, the conductive plastics used in the present application to form the back-electrode 104 contain fillers that form sufficient conductive current-carrying paths through the plastic matrix to support the photovoltaic current generated by the solar cells with negligible resistive losses. The plastic matrix of the conductive plastic is typically insulating, but the composite produced exhibits the conductive properties of the filler. In one embodiment, the back-electrode 104 is made of molybdenum.

Figure 4C:
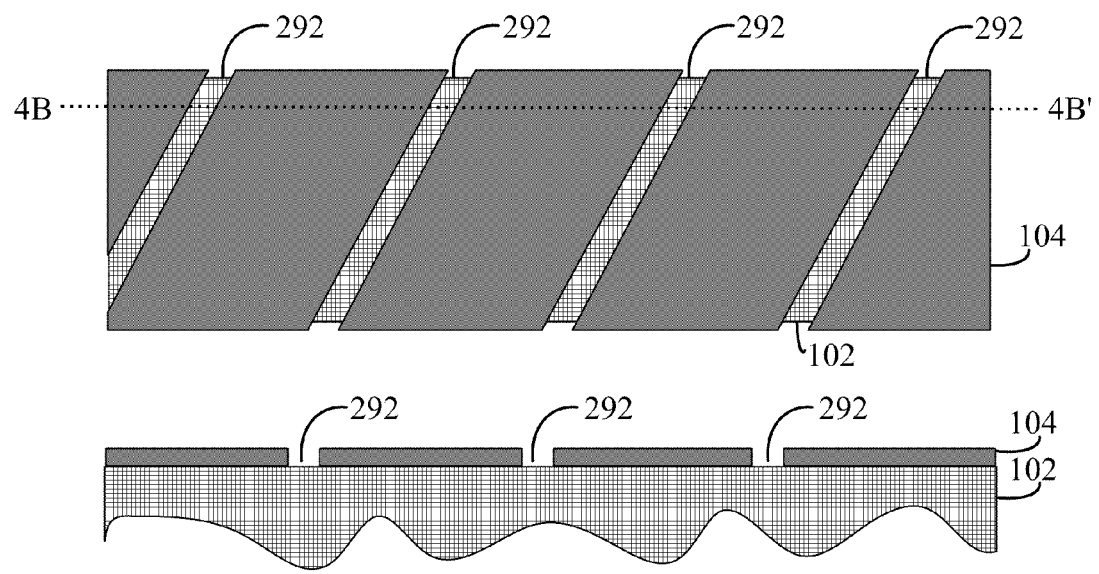

Scribing the Back-Electrode (320). FIG. 4C illustrates a plan view and a cross-sectional view along line 4C-4C' of a structure formed after scribing back-electrode 104 about the substrate 102 (step 320 of FIG. 3).

FIG. 4C illustrates an embodiment having a single helical groove 292 that has been cut into the back-electrode 104. In some embodiments, the groove 292 is deep enough to expose a portion of the surface of the substrate 102 underneath the back-electrode 104, i.e., groove 292 extends throughout the thickness of the back-electrode 104. The helical groove 292 need not be a "pure helix," that is, there can be some variation (e.g., "wobble") in the shape of the helix about the circumference of the substrate. As noted above, the groove 292 need not be helical at all, but instead can have a repeating or non-repeating pattern.

In some embodiments, the back-electrode groove 292 is cut using laser scribing techniques. Methods of laser scribing a photovoltaic module are known in the art, and in addition can be found in U.S. patent application Ser. No. 11/499,608 filed Aug. 4, 2006, the entire contents of which are incorporated by reference herein. In other embodiments, the back-electrode groove 292 is cut using mechanical scribing techniques, e.g., constant-force mechanical scribing, such as described in U.S. Patent Application No. 60/980,372. A constant-force mechanical scriber can exert a substantially constant force on the photovoltaic module during scribing, regardless of the distance between the scriber and the layer being scribed. Thus a constant-force mechanical scriber can cut grooves such as back-electrode groove 292 with precision even when non-symmetry exists in the substrate.

To scribe the back-electrode layer 104 with a scriber (e.g., a constant-force mechanical scriber), the scriber and the substrate 102 (with back-electrode 104 disposed thereon) are moved both rotationally and translationally relative to each other. In some embodiments only the substrate 102 is moved rotationally and translationally, while in other embodiments only the scriber is moved rotationally (moved about the substrate) and translationally (laterally relative to the substrate), while in other embodiments the scriber is moved translationally and the substrate 102 is moved rotationally, while in other embodiments the substrate 102 is moved translationally and the scriber is moved translationally, while in still other embodiments both the substrate and the scriber are moved both translationally and rotationally.

Suitable mechanisms for translating scribers and substrates rotationally and/or translationally will be readily apparent to those skilled in the art as well as in U.S. Patent Application Nos. 60/922,290; 11/801,469; 11/801,723; 60/958,193 and 11/983,239, each of which is hereby incorporated by reference herein in its entirety.

In one example, the substrate is moved rotationally while the scriber is moved translationally. In this example, the scriber is engaged with the back-electrode layer at a first end of the substrate. The scriber is translated laterally with at a constant or nonconstant velocity and the substrate is rotated with a velocity of between about 50 revolutions per minute (RPM) to about 3000 RPM, e.g., about 960 RPM. As the scriber moves laterally and the substrate 102 moves rotationally, the scriber traces a groove in the back-electrode layer 104 that traverses a plurality of times about the substrate 102. In some embodiments, the groove thus formed is helical, and the pitch of the helical groove is based on the lateral velocity of the scriber and the rotational velocity of the substrate, which in turn is based on the dimensions of the substrate. In some embodiments, the width of the groove thus formed in the back-electrode layer 104 is, on average, from about 10 microns to about 150 microns, e.g., about 90 microns. In some embodiments, the width of the groove is determined by the dimensions of the scriber (e.g., the shape of the laser or knife used to scribe the groove). When the scriber reaches the second end of the substrate, the scriber is disengaged from the back-electrode layer. In some embodiments, the groove is cleaned after groove formation. In some embodiments, the groove is not cleaned after groove formation.

Figure 4D:
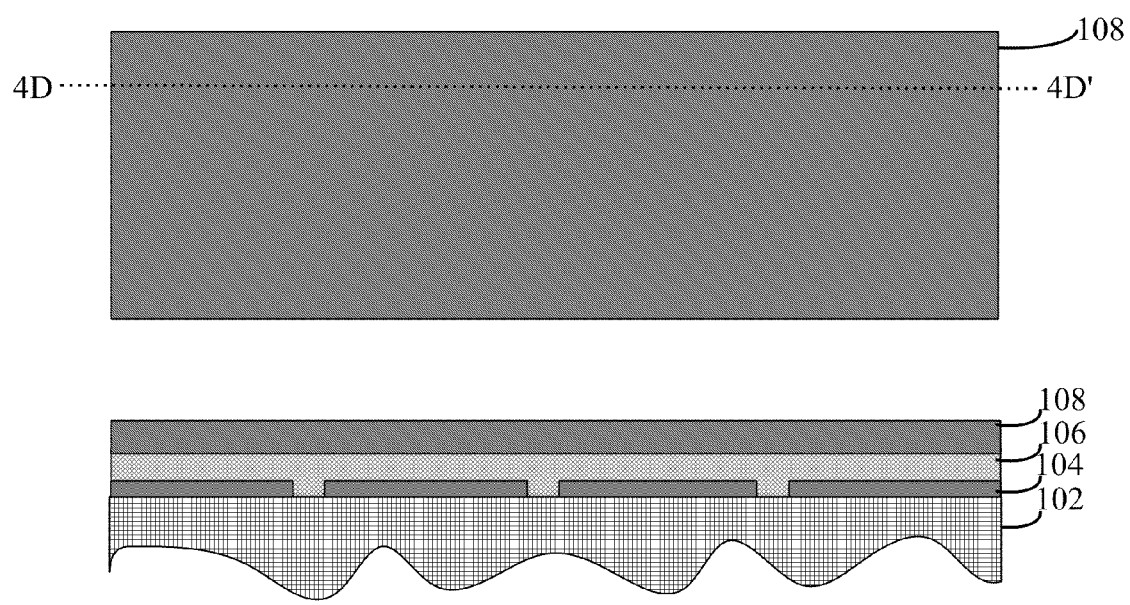

Disposing the Semiconductor Junction (330). FIG. 4D illustrates a plan view and a cross-sectional view along line 4D-4D' of a structure formed after disposing a nonplanar semiconductor junction, e.g., absorber layer 106 and junction partner layer 108, on the back-electrode 104 (step 330 of FIG. 3). Portions of the semiconductor junction, e.g., portions of absorber layer 106 and/or junction partner layer 108, fill in the back-electrode groove 292 cut into the back-electrode.

In general, the semiconductor junction can be any photovoltaic homojunction, heterojunction, heteroface junction, buried homojunction, p-i-n junction or a tandem junction having an absorber layer that is a direct band-gap absorber (e.g., crystalline silicon) or an indirect band-gap absorber (e.g., amorphous silicon). Such junctions are described in Chapter 1 of Bube, *Photovoltaic Materials*, 1998, Imperial College Press, London, as well as Lugue and Hegedus, 2003, *Handbook of Photovoltaic Science and Engineering*, John Wiley & Sons, Ltd., West Sussex, England, each of which is hereby incorporated by reference herein in its entirety. Details of exemplary types of semiconductors junctions in accordance with the present application are disclosed below. In addition to the exemplary junctions disclosed below, such semiconductor junctions can be multi-junctions in which light traverses into the core of the junction through multiple junctions that, in some embodiments, have successively smaller band gaps.

Optionally, the semiconductor junction includes an intrinsic layer (i-layer) (not shown) disposed on junction partner layer 108. The i-layer can be formed using, for example, any undoped transparent oxide including, but not limited to, zinc oxide, metal oxide, or any transparent material that is highly insulating. In some embodiments, the i-layer is highly pure zinc oxide.

In some embodiments, the absorber layer 106 includes copper-indium-gallium-diselenide (CIGS). Different examples of suitable layers for use in the semiconductor junction, and methods of making same, are described in greater detail below.

Figure 4E:
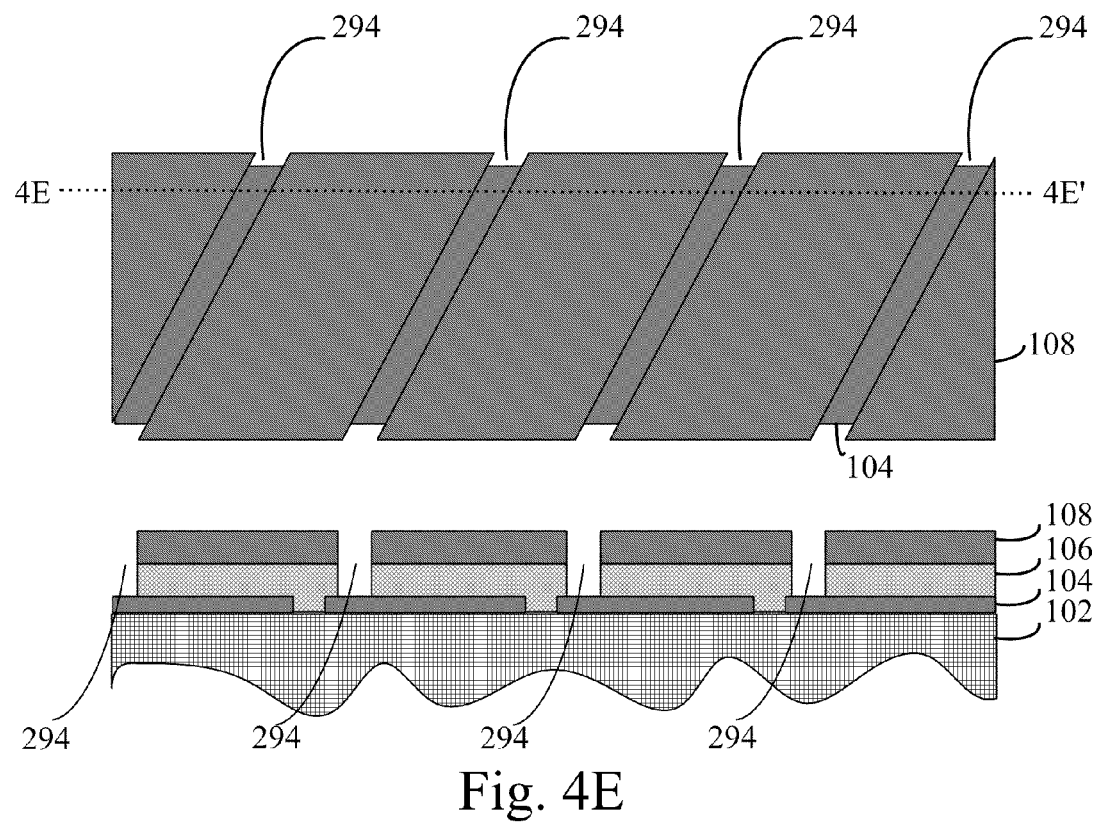

Scribing the Semiconductor Junction (340). FIG. 4E illustrates a plan view and a cross-sectional view along line 4E-4E' of a structure formed after scribing the semiconductor junction, e.g., the junction partner layer 108 and the absorber layer 106, a plurality of times about the substrate 102 (step 340 of FIG. 3).

FIG. 4E illustrates an embodiment in which a single helical groove 294 has been cut into the junction partner layer 108 and the absorber layer 106. In some embodiments, the groove 294 is deep enough to expose a portion of the surface of the back-electrode 104 underneath the junction partner layer 108 and the absorber layer 106, i.e., the groove 294 extends throughout the thickness of the junction partner layer 108 and the absorber layer 106. The helical groove 294 need not be a "pure helix," that is, there can be some variation (e.g., "wobble") in the shape of the helix about the circumference of the substrate. As noted above, the groove 294 need not be helical at all, but instead can have a repeating or non-repeating pattern.

In some embodiments, mechanical scribing (e.g., constant-force mechanical scribing) is used to create the semiconductor junction groove 294, in order to reduce non-uniformities that can arise from non-symmetries in the solar cell. As described above with respect to FIG. 4C, there are several options for rotational and/or translational movement of the substrate 102 and/or the scriber, the implementation of which will be apparent to those skilled in the art.

In some embodiments, semiconductor junction groove 294 is formed while rotating the substrate at a speed of about 50 RPM to about 3000 RPM, e.g., 500 RPM, and translating the scriber at a constant velocity or at variable velocities. In some embodiments, the semiconductor junction groove 294 has an average width from about 50 microns to about 150 microns, e.g., about 80 microns. The pitch of the groove 294 can be substantially the same as the pitch of the groove 292.

Figure 4F:
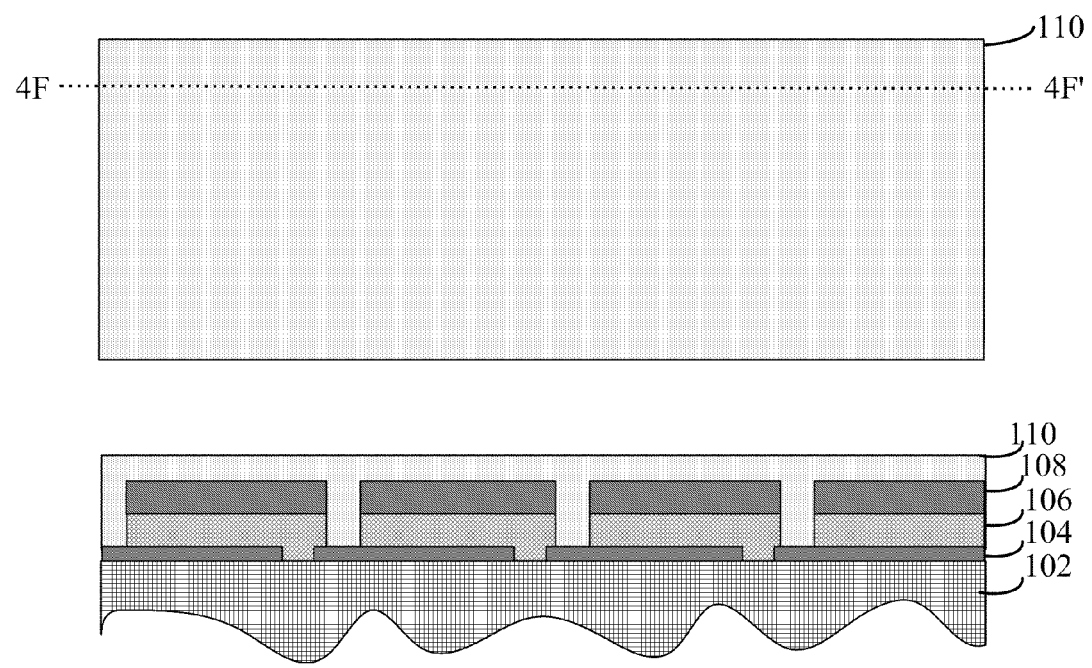

Disposing the Transparent Conductor Layer (350). FIG. 4F illustrates a plan view and a cross-sectional view along line 4F-4F' of a structure formed after disposing a nonplanar transparent conductor layer 110 on the semiconductor layer, e.g., on the scribed junction partner layer 108 and scribed absorber layer 106 (step 350 of FIG. 3). Portions of the transparent conductor layer 110 fill the back-electrode groove 294, and enable monolithic integration of solar cells in photovoltaic module 420 by providing an electrical communication pathway between the transparent conductor layer portion of one solar cell and the back-electrode portion of an adjacent solar cell. Methods of forming transparent conductor layers are known in the art.

In some embodiments, the transparent conductor 110 is made of tin oxide $SnO_x$ (with or without fluorine doping), indium-tin oxide (ITO), doped zinc oxide (e.g., aluminum doped zinc oxide, gallium doped zinc oxide, boron doped zinc oxide), indium-zinc oxide or any combination thereof. In some embodiments, the transparent conductor 110 is either p-doped or n-doped. For example, in embodiments where the outer layer of the junction 410 is p-doped, the transparent conductor 110 can be p-doped. Likewise, in embodiments where the outer layer of junction 410 is n-doped, the transparent conductor 110 can be n-doped. In general, the transparent conductor 110 is preferably made of a material that has very low resistance, suitable optical transmission properties (e.g., transmits greater than 90% of the spectrum the semiconductor junction uses to generate electricity), and a deposition temperature that will not damage underlying layers 108, 106, 104, or substrate 102.

In some embodiments, the transparent conductor 110 includes carbon nanotubes. Carbon nanotubes are commercially available, for example, from Eikos (Franklin, Mass.) and are described in U.S. Pat. No. 6,988,925, which is hereby incorporated by reference herein in its entirety. In some embodiments, the transparent conductor 110 is an electrically conductive polymer material such as a conductive polythiophene, a conductive polyaniline, a conductive polypyrrole, a PSS-doped PEDOT (e.g., Bayrton), or a derivative of any of the foregoing.

In some embodiments, the transparent conductor 110 includes more than one layer, e.g., a first layer including tin oxide $SnO_x$ (with or without fluorine doping), indium-tin oxide (ITO), indium-zinc oxide, doped zinc oxide (e.g., aluminum doped zinc oxide, gallium doped zinc oxide, boron doped zinc oxide) or a combination thereof and a second layer including a conductive polythiophene, a conductive polyaniline, a conductive polypyrrole, a PSS-doped PEDOT (e.g., Bayrton), or a derivative of any of the foregoing. Additional suitable materials that can be used to form the transparent conductor 110 are disclosed in United States Patent publication 2004/0187917A1 to Pichler, which is hereby incorporated by reference herein in its entirety.

Figure 4G:
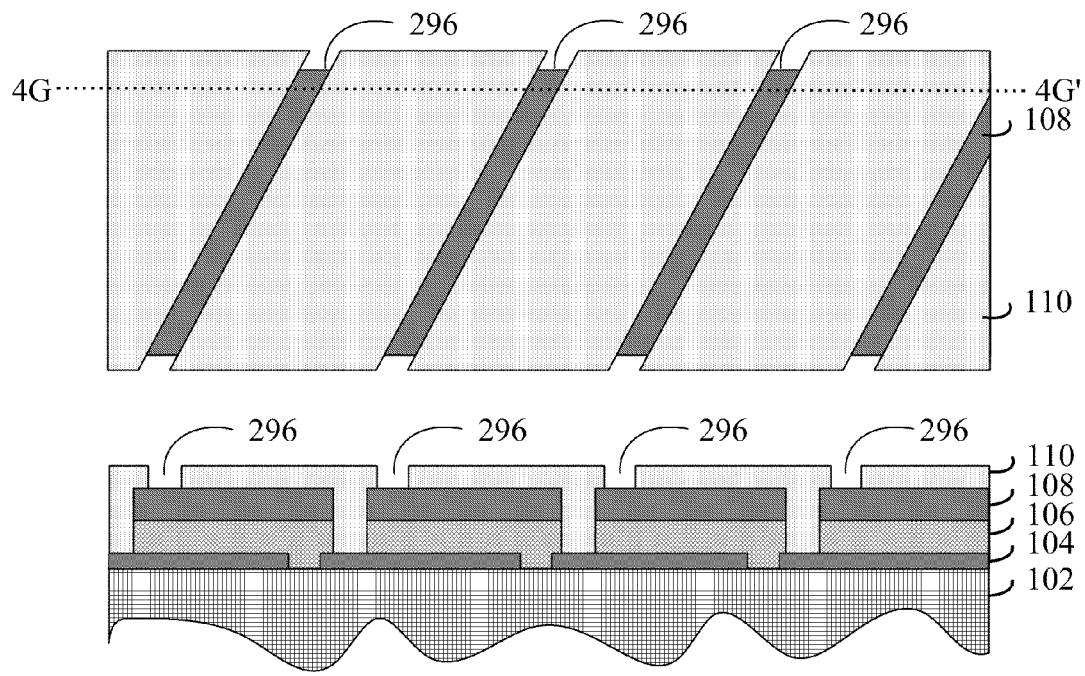

Scribing the Transparent Conductor Layer (370). FIG. 4G illustrates a plan view and a cross-sectional view along line 4G-4G' of a structure formed after scribing the transparent conductor layer 110 about the substrate 102 (step 360 of FIG. 3).

FIG. 4G illustrates an embodiment having a single helical groove 296 that has been cut into the transparent conductor layer 110. In some embodiments, the groove 296 is deep enough to expose a portion of the surface of the junction partner layer 108 underneath the transparent conductor layer 110, i.e., the groove 296 extends throughout the thickness of the transparent conductor layer 110. The helical groove 296 need not be a "pure helix," that is, there can be some variation (e.g., "wobble") in the shape of the helix about the circumference of the substrate. As noted above, the groove 292 need not be helical at all, but instead can have a repeating or non-repeating pattern.

In some embodiments, mechanical scribing (e.g., constant-force mechanical scribing) is used to create the transparent conductor groove 296, in order to reduce non-uniformities that can arise from non-symmetries in the solar cell. As described above with respect to FIG. 4C, there are several options for rotational and/or translational movement of the substrate 102 and/or the scriber, the implementation of which will be apparent to those skilled in the art.

In some embodiments, the substrate is rotated at a speed of about 50 RPM to about 3000 RPM, e.g., 500 RPM, while scribing the semiconductor junction groove 294. In some embodiments, the semiconductor junction groove 294 has an average width from about 50 microns to about 300 microns, e.g., about 150 microns. In embodiments in which the grooves 292 and 294 are helical, the pitch of the groove 294 can be substantially the same as the pitch of the groove 292.

Figure 4H:
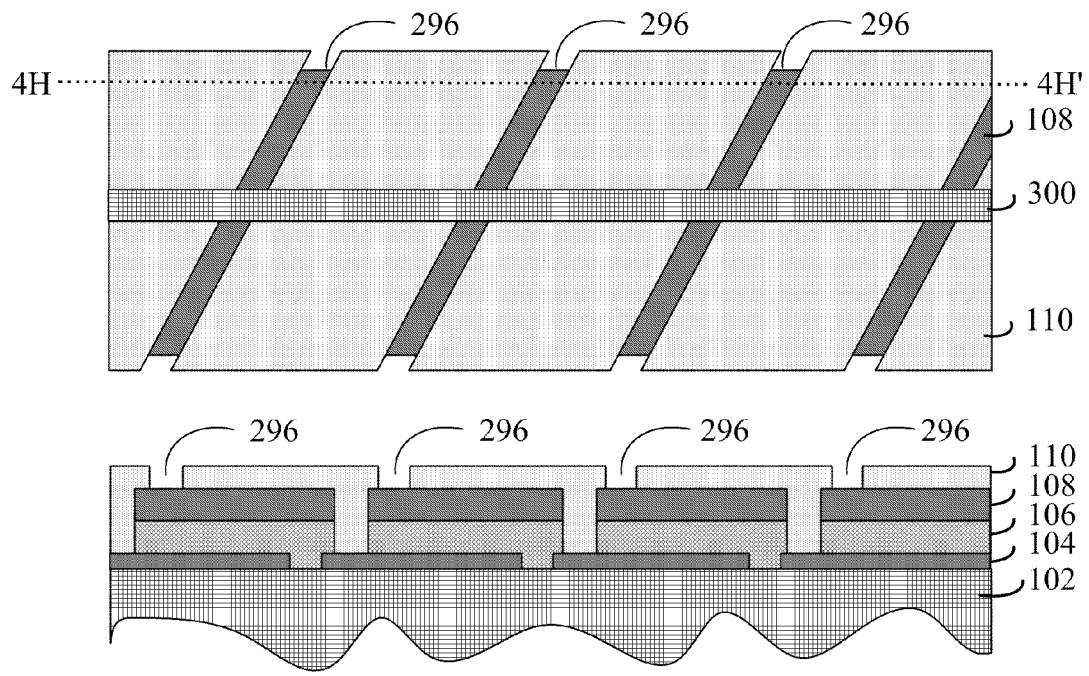

Scribing the Back-Electrode Layer, Semiconductor Junction, and Transparent Conductor Layer (370). FIG. 4H illustrates a plan view and a cross-sectional view along line 4H-4H' of a structure formed after scribing the back-electrode layer 104, semiconductor junction (e.g., junction partner layer 108 and absorber layer 106), and transparent conductor layer 110 along the length of the substrate 102 (step 370 of FIG. 3).

FIG. 4H illustrates a single groove 300 that has been cut into the back-electrode layer 104, absorber layer 106, junction partner layer 108, and transparent conductor layer 110. In some embodiments, the groove 300 is deep enough to expose a portion of the surface of the substrate 102, i.e., the groove 300 extends throughout the thickness of the back-electrode layer 104, absorber layer 106, junction partner layer 108, and transparent conductor layer 110. Although FIG. 4H illustrates a linear groove 300, the groove 300 need not be linear. For example, the groove 300 can be wavy, jagged, or have various regular or irregular features, so long as groove 300 generally extends along the length of substrate 120, and that grooves 292, 294, 296, and 300 together divide layers 104, 106, 108, and 110 into separate respective portions.

In some embodiments, mechanical scribing (e.g., constant-force mechanical scribing) is used to create groove 300, while in other embodiments, laser scribing is used to create groove 300. To form groove 300, the scriber and the substrate 102 are laterally translated relative to each other, e.g., only the scriber is laterally translated, only the substrate is laterally translated, or both the scriber and the substrate are laterally translated. The implementations of such translations will be apparent to those skilled in the art.

Figure 4I:
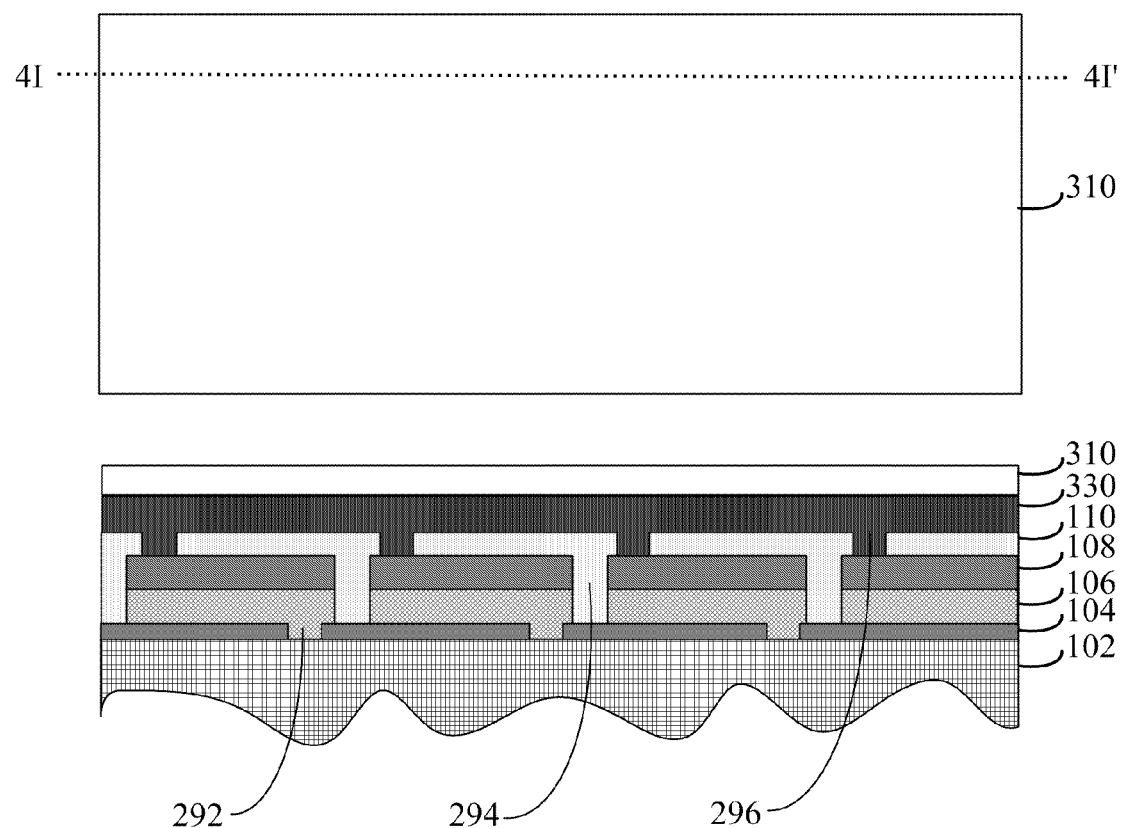

Optionally Encasing the Module (380). FIG. 4I illustrates a plan view and a cross-sectional view along line 4I-4I' of a structure formed after optionally encasing the substrate, scribed back-electrode layer 104, scribed semiconductor junction (e.g., junction partner layer 108 and absorber layer 106), and scribed transparent conductor layer 110, in a non-planar casing with filler (step 380 of FIG. 3).

In the embodiment illustrated in FIG. 4I, the transparent casing 310 is disposed on top of the transparent conductor 110. In some embodiments, an optional filler layer (not shown in FIG. 3H) is disposed on the transparent conductor 110, and then, optionally, a transparent casing is disposed on top of the filler layer. The optional transparent casing 310 helps to protect the solar cells in photovoltaic module 420 from the environment. In some embodiments, the transparent casing 310 is circumferentially disposed on transparent conductor 110 and/or optional filler layer 330. In some embodiments, the transparent casing 310 is made of plastic or glass. Methods, such as heat shrinking, injection molding, or vacuum loading, can be used to construct transparent tubular casing 310 such that oxygen and water is excluded from the system. In some embodiments, the transparent casing 310 has a cylindrical shape.

In some embodiments, the transparent casing 310 is made of a urethane polymer, an acrylic polymer, polymethylmethacrylate (PMMA), a fluoropolymer, silicone, poly-dimethyl siloxane (PDMS), silicone gel, epoxy, ethylene vinyl acetate (EVA), perfluoroalkoxy fluorocarbon (PFA), nylon/polyamide, cross-linked polyethylene (PEX), polyolefin, polypropylene (PP), polyethylene terephtalate glycol (PETG), polytetrafluoroethylene (PTFE), thermoplastic copolymer (for example, ETFE® which is a derived from the polymerization of ethylene and tetrafluoroethylene: TEFLON® monomers), polyurethane/urethane, polyvinyl chloride (PVC), polyvinylidene fluoride (PVDF), TYGON®, vinyl, VITON®, or any combination or variation thereof.

In some embodiments, the transparent casing 310 includes a plurality of casing layers. In some embodiments, each casing layer is composed of a different material. For example, in some embodiments, the transparent casing 310 includes a first transparent casing layer and a second transparent casing layer. Depending on the exact configuration of the photovoltaic module, the first transparent casing layer can be disposed on the transparent conductor 110, optional filler layer 330 or a water resistant layer. The second transparent casing layer can be disposed on the first transparent casing layer.

In some embodiments, each transparent casing layer has different properties. In one example, the outer transparent casing layer has excellent UV shielding properties whereas the inner transparent casing layer has good water proofing characteristics. Moreover, the use of multiple transparent casing layers can be used to reduce costs and/or improve the overall properties of the transparent casing 310. For example, one transparent casing layer may be made of an expensive material that has a desired physical property. By using one or more additional transparent casing layers, the thickness of the expensive transparent casing layer may be reduced, thereby achieving a savings in material costs. In another example, one transparent casing layer may have excellent optical properties (e.g., index of refraction, etc.) but be very heavy. By using one or more additional transparent casing layers, the thickness of the heavy transparent casing layer may be reduced, thereby reducing the overall weight of transparent casing 310. In some embodiments, only one end of the photovoltaic module is exposed by transparent casing 310 in order to form an electrical connection with adjacent solar cells or other circuitry. In some embodiments, both ends of the elongated photovoltaic module are exposed by transparent casing 310 in order to form an electrical connection with adjacent solar cells 12 or other circuitry. More discussion of transparent casings 310 that can be used in some embodiments of the present application is disclosed in U.S. patent application Ser. No. 11/378,847, which is hereby incorporated by reference herein in its entirety. Additional optional layers that can be disposed on the transparent casing 310 or the optional filler layer 330 are discussed below.

Although the casing 310 is referred to as "transparent," it should be recognized that most materials are only partially transparent, e.g., will reflect and/or absorb at least a small fraction of the light impinging it. As used herein, "transparent" means that at least a portion of impinging visible light transmits through the material.

The filler layer 330 can also be used to protect the solar cell 12 from physical or other damage, and can also be used to aid the solar cell in collecting more light by its optical and chemical properties.

The layer 330 can be made of sealant such as ethylene vinyl acetate (EVA), silicone, silicone gel, epoxy, polydimethyl siloxane (PDMS), RTV silicone rubber, polyvinyl butyral (PVB), thermoplastic polyurethane (TPU), a polycarbonate, an acrylic, a fluoropolymer, and/or a urethane, and can be coated over the transparent conductor 110 to seal out air and, optionally, to provide complementary fitting to a transparent casing 310. In some embodiments, the filler layer 330 is a Q-type silicone, a silsequioxane, a D-type silicone, or an M-type silicone.

In one embodiment, the substance used to form a filler layer 330 includes a resin or resin-like substance, the resin potentially being added as one component, or added as multiple components that interact with one another to effect a change in viscosity. In another embodiment, the resin can be diluted with a less viscous material, such as a silicone-based oil or liquid acrylates. In these cases, the viscosity of the initial substance can be far less than that of the resin material itself.

In one example, a medium viscosity polydimethylsiloxane mixed with an elastomer-type dielectric gel can be used to make the filler layer 330. In one case, as an example, a mixture of 85% (by weight) Dow Corning 200 fluid, 50 centistoke viscosity (PDMS, polydimethylsiloxane); 7.5% Dow Corning 3-4207 Dielectric Tough Gel, Part A—Resin; and 7.5% Dow Corning 3-4207 Dielectric Tough Gel, Part B—Catalyst is used to form the filler layer 330. Other oils, gels, or silicones can be used to produce much of what is described in this disclosure and, accordingly, this disclosure should be read to include those other oils, gels and silicones to generate a filler layer 330. Such oils include silicone-based oils, and the gels include many commercially available dielectric gels. Curing of silicones can also extend beyond a gel like state. Commercially available dielectric gels and silicones and the various formulations are contemplated as being usable in this disclosure.

In one example, the composition used to form the filler layer 330 is 85%, by weight, polydimethylsiloxane polymer liquid, where the polydimethylsiloxane has the chemical formula $(CH_3)_3SiO[SiO(CH_3)_2]_nSi(CH_3)_3$, where n is a range of integers chosen such that the polymer liquid has an average bulk viscosity that falls in the range between 50 centistokes and 100,000 centistokes (all viscosity values given herein for compositions assume that the compositions are at room temperature). Thus, there may be polydimethylsiloxane molecules in the polydimethylsiloxane polymer liquid with varying values for n provided that the bulk viscosity of the liquid falls in the range between 50 centistokes and 100,000 centistokes. Bulk viscosity of the polydimethylsiloxane polymer liquid may be determined by any of a number of methods known to those of skill in the art, such as using a capillary viscometer. Further, the composition includes 7.5%, by weight, of a silicone elastomer including at least sixty percent, by weight, dimethylvinyl-terminated dimethyl siloxane (CAS number 68083-19-2) and between 3 and 7 percent by weight silicate (New Jersey TSRN 14962700-537 6P). Further, the composition includes 7.5%, by weight, of a silicone elastomer including at least sixty percent, by weight, dimethylvinyl-terminated dimethyl siloxane (CAS number 68083-19-2), between ten and thirty percent by weight hydrogen-terminated dimethyl siloxane (CAS 70900-21-9) and between 3 and 7 percent by weight trimethylated silica (CAS number 68909-20-6).

In some embodiments, the filler layer 330 is formed by soft and flexible optically suitable material such as silicone gel. For example, in some embodiments, the filler layer 330 is formed by a silicone gel such as a silicone-based adhesive or sealant. In some embodiments, the filler layer 330 is formed by GE RTV 615 Silicone. RTV 615 is an optically clear, two-part flowable silicone product that requires SS4120 as primer for polymerization (RTV615-1P), both available from General Electric (Fairfield, Conn.). Silicone-based adhesives or sealants are based on tough silicone elastomeric technology. The characteristics of silicone-based materials, such as adhesives and sealants, are controlled by three factors: resin mixing ratio, potting life and curing conditions.

Advantageously, silicone adhesives have a high degree of flexibility and very high temperature resistance (up to 600° F.). Silicone-based adhesives and sealants have a high degree of flexibility. Silicone-based adhesives and sealants are available in a number of technologies (or cure systems). These technologies include pressure sensitive, radiation cured, moisture cured, thermo-set and room temperature vulcanizing (RTV). In some embodiments, the silicone-based sealants use two-component addition or condensation curing systems or single component (RTV) forms. RTV forms cure easily through reaction with moisture in the air and give off acid fumes or other by-product vapors during curing.

Pressure sensitive silicone adhesives adhere to most surfaces with very slight pressure and retain their tackiness. This type of material forms viscoelastic bonds that are aggressively and permanently tacky, and adheres without the need of more than finger or hand pressure. In some embodiments, radiation is used to cure silicone-based adhesives. In some embodiments, ultraviolet light, visible light or electron beam irradiation is used to initiate curing of sealants, which allows a permanent bond without heating or excessive heat generation. While UV-based curing requires one substrate to be UV transparent, the electron beam can penetrate through material that is opaque to UV light. Certain silicone adhesives and cyanoacrylates based on a moisture or water curing mechanism may need additional reagents properly attached to the photovoltaic module 402 without affecting the proper functioning of the solar cells 12 of the photovoltaic module. Thermo-set silicone adhesives and silicone sealants are cross-linked polymeric resins cured using heat or heat and pressure. Cured thermo-set resins do not melt and flow when heated, but they may soften. Vulcanization is a thermosetting reaction involving the use of heat and/or pressure in conjunction with a vulcanizing agent, resulting in greatly increased strength, stability and elasticity in rubber-like materials. RTV silicone rubbers are room temperature vulcanizing materials. The vulcanizing agent is a cross-linking compound or catalyst. In some embodiments in accordance with the present application, sulfur is added as the traditional vulcanizing agent.

In one example, the composition used to form a filler layer 330 is silicone oil mixed with a dielectric gel. The silicone oil is a polydimethylsiloxane polymer liquid, whereas the dielectric gel is a mixture of a first silicone elastomer and a second silicone elastomer. As such, the composition used to form the filler layer 330 is X %, by weight, polydimethylsiloxane polymer liquid, Y %, by weight, a first silicone elastomer, and Z %, by weight, a second silicone elastomer, where X, Y, and Z sum to 100. Here, the polydimethylsiloxane polymer liquid has the chemical formula $(CH_3)_3SiO[SiO(CH_3)_2]_nSi(CH_3)_3$, where n is a range of integers chosen such that the polymer liquid has an average bulk viscosity that falls in the range between 50 centistokes and 100,000 centistokes. Thus, there may be polydimethylsiloxane molecules in the polydimethylsiloxane polymer liquid with varying values for n provided that the bulk viscosity of the liquid falls in the range between 50 centistokes and 100,000 centistokes. The first silicone elastomer includes at least sixty percent, by weight, dimethylvinyl-terminated dimethyl siloxane (CAS number 68083-19-2) and between 3 and 7 percent by weight silicate (New Jersey TSRN 14962700-537 6P). Further, the second silicone elastomer includes at least sixty percent, by weight, dimethylvinyl-terminated dimethyl siloxane (CAS number 68083-19-2), between ten and thirty percent by weight hydrogen-terminated dimethyl siloxane (CAS 70900-21-9) and between 3 and 7 percent by weight trimethylated silica (CAS number 68909-20-6). In this embodiment, X may range between 30 and 90, Y may range between 2 and 20, and Z may range between 2 and 20, provided that X, Y and Z sum to 100 percent.

In another example, the composition used to form the filler layer 330 is silicone oil mixed with a dielectric gel. The silicone oil is a polydimethylsiloxane polymer liquid, whereas the dielectric gel is a mixture of a first silicone elastomer and a second silicone elastomer. As such, the composition used to form the filler layer 330 is X %, by weight, polydimethylsiloxane polymer liquid, Y %, by weight, a first silicone elastomer, and Z %, by weight, a second silicone elastomer, where X, Y, and Z sum to 100. Here, the polydimethylsiloxane polymer liquid has the chemical formula $(CH_3)_3 SiO[SiO(CH_3)_2]_n Si(CH_3)_3$, where n is a range of integers chosen such that the polymer liquid has a volumetric thermal expansion coefficient of at least $500 \times 10^{-6}/°C$. Thus, there may be polydimethylsiloxane molecules in the polydimethylsiloxane polymer liquid with varying values for n provided that the polymer liquid has a volumetric thermal expansion coefficient of at least $960 \times 10^{-6}/°C$. The first silicone elastomer includes at least sixty percent, by weight, dimethylvinyl-terminated dimethyl siloxane (CAS number 68083-19-2) and between 3 and 7 percent by weight silicate (New Jersey TSRN 14962700-537 6P). Further, the second silicone elastomer includes at least sixty percent, by weight, dimethylvinyl-terminated dimethyl siloxane (CAS number 68083-19-2), between ten and thirty percent by weight hydrogen-terminated dimethyl siloxane (CAS 70900-21-9) and between 3 and 7 percent by weight trimethylated silica (CAS number 68909-20-6). In this embodiment, X may range between 30 and 90, Y may range between 2 and 20, and Z may range between 2 and 20, provided that X, Y and Z sum to 100 percent.

In some embodiments, the composition used to form the filler layer 330 is a crystal clear silicone oil mixed with a dielectric gel. In some embodiments, the filler layer has a volumetric thermal coefficient of expansion of greater than $250 \times 10^{-6}/°C$., greater than $300 \times 10^{-6}/°C$., greater than $400 \times 10^{-6}/°C$., greater than $500 \times 10^{-6}/°C$., greater than $1000 \times 10^{-6}/°C$., greater than $2000 \times 10^{-6}/°C$., greater than $5000 \times 10^{-6}/°C$., or between $250 \times 10^{-6}/°C$. and $10000 \times 10^{-6}/°C$.

In some embodiments, a silicone-based dielectric gel can be used in-situ to form the filler layer 330. The dielectric gel can also be mixed with a silicone based oil to reduce both beginning and ending viscosities. The ratio of silicone-based oil by weight in the mixture can be varied. The percentage of silicone-based oil by weight in the mixture of silicone-based oil and silicone-based dielectric gel can have values at or about (e.g. ±2.5%) 25%, 30%, 35%, 40%, 45%, 50%, 55%, 60%, 65%, 70%, 75%, and 85%. Ranges of 20%-30%, 25%-35%, 30%-40%, 35%-45%, 40%-50%, 45%-55%, 50%-60%, 55%-65%, 60%-70%, 65%-75%, 70%-80%, 75%-85%, and 80%-90% (by weight) are also contemplated. Further, these same ratios by weight can be contemplated for the mixture when using other types of oils or acrylates instead of or in addition to silicon-based oil to lessen the beginning viscosity of the gel mixture alone.

The initial viscosity of the mixture of 85% Dow Corning 200 fluid, 50 centistoke viscosity (PDMS, polydimethylsiloxane); 7.5% Dow Corning 3-4207 Dielectric Tough Gel, Part A—Resin 7.5% Dow Corning 3 4207 Dielectric Tough Gel, Part B—Pt Catalyst is approximately 100 centipoise (cP). Beginning viscosities of less than 1, less than 5, less than 10, less than 25, less than 50, less than 100, less than 250, less than 500, less than 750, less than 1000, less than 1200, less than 1500, less than 1800, and less than 2000 cP are imagined, and any beginning viscosity in the range 1-2000 cP is acceptable. Other ranges can include 1-10 cP, 10-50 cP, 50-100 cP, 100-250 cP, 250-500 cP, 500-750 cP, 750-1000 cP, 800-1200 cP, 1000-1500 cP, 1250-1750 cP, 1500-2000 cP, and 1800-2000 cP. In some cases an initial viscosity between 1000 cP and 1500 cP can also be used.

A final viscosity for the filler layer 330 of well above the initial viscosity is envisioned in some embodiments. In most cases, a ratio of the final viscosity to the beginning viscosity is at least 50:1. With lower beginning viscosities, the ratio of the final viscosity to the beginning viscosity may be 20,000:1, or in some cases, up to 50,000:1. In most cases, a ratio of the final viscosity to the beginning viscosity of between 5,000:1 to 20,000:1, for beginning viscosities in the 10 cP range, may be used. For beginning viscosities in the 1000 cP range, ratios of the final viscosity to the beginning viscosity between 50:1 to 200:1 are imagined. In short order, ratios in the ranges of 200:1 to 1,000:1, 1,000:1 to 2,000:1, 2,000:1 to 5,000:1, 5,000:1 to 20,000:1, 20,000:1 to 50,000:1, 50,000:1 to 100,000:1, 100,000:1 to 150,000:1, and 150,000:1 to 200,000:1 are contemplated.

The final viscosity of the filler layer 330 is typically on the order of 50,000 cP to 200,000 cP. In some cases, a final viscosity of at least $1 \times 10^6$ cP is envisioned. Final viscosities of at least 50,000 cP, at least 60,000 cP, at least 75,000 cP, at least 100,000 cP, at least 150,000 cP, at least 200,000 cP, at least 250,000 cP, at least 300,000 cP, at least 500,000 cP, at least 750,000 cP, at least 800,000 cP, at least 900,000 cP, and at least $1 \times 10^6$ cP are found in alternative embodiments. Ranges of final viscosity for the filler layer can include 50,000 cP to 75,000 cP, 60,000 cP to 100,000 cP, 75,000 cP to 150,000 cP, 100,000 cP to 200,000 cP, 100,000 cP to 250,000 cP, 150,000 cP to 300,000 cP, 200,000 cP to 500,000 cP, 250,000 cP to 600,000 cP, 300,000 cP to 750,000 cP, 500,000 cP to 800,000 cP, 600,000 cP to 900,000 cP, and 750,000 cP to $1 \times 10^6$ cP.

Curing temperatures for the filler layer 330 can be numerous, with a common curing temperature of room temperature. The curing step need not involve adding thermal energy to the system. Temperatures that can be used for curing can be envisioned (with temperatures in degrees F.) at up to 60 degrees, up to 65 degrees, up to 70 degrees, up to 75 degrees, up to 80 degrees, up to 85 degrees, up to 90 degrees, up to 95 degrees, up to 100 degrees, up to 105 degrees, up to 110 degrees, up to 115 degrees, up to 120 degrees, up to 125 degrees, and up to 130 degrees, and temperatures generally between 55 and 130 degrees. Other curing temperature ranges can include 60-85 degrees, 70-95 degrees, 80-110 degrees, 90-120 degrees, and 100-130 degrees.

The working time of the substance of a mixture can be varied as well. The working time of a mixture in this context means the time for the substance (e.g., the substance used to form the filler layer 330) to cure to a viscosity more than double the initial viscosity when mixed. Working time for the layer can be varied. In particular, working times of less than 5 minutes, on the order of 10 minutes, up to 30 minutes, up to 1 hour, up to 2 hours, up to 4 hours, up to 6 hours, up to 8 hours, up to 12 hours, up to 18 hours, and up to 24 hours are all contemplated. A working time of 1 day or less is found to be best in practice. Any working time between 5 minutes and 1 day is acceptable.

In context of this disclosure, resin can mean both synthetic and natural substances that have a viscosity prior to curing and a greater viscosity after curing. The resin can be unitary in nature, or may be derived from the mixture of two other substances to form the resin.

In some embodiments, the filler layer 330 is a laminate layer such as any of those disclosed in U.S. Provisional patent application No. 60/906,901, filed Mar. 13, 2007, entitled "A Photovoltaic Apparatus Having a Laminate Layer and Method for Making the Same" which is hereby incorporated by reference herein in its entirety. In some embodiments, the filler layer 330 has a viscosity of less than $1 \times 10^6$ cP. In some embodiments, the filler layer 330 has a thermal coefficient of expansion of greater than $500 \times 10^{-6}$/° C. or greater than $1000 \times 10^{-6}$/° C. In some embodiments, the filler layer 330 includes epolydimethylsiloxane polymer. In some embodiments, the filler layer 330 includes by weight: less than 50% of a dielectric gel or components to form a dielectric gel; and at least 30% of a transparent silicone oil, the transparent silicone oil having a beginning viscosity of no more than half of the beginning viscosity of the dielectric gel or components to form the dielectric gel. In some embodiments, the filler layer 330 has a thermal coefficient of expansion of greater than $500 \times 10^{-6}$/° C. and includes by weight: less than 50% of a dielectric gel or components to form a dielectric gel; and at least 30% of a transparent silicone oil. In some embodiments, the filler layer 330 is formed from silicone oil mixed with a dielectric gel. In some embodiments, the silicone oil is a polydimethylsiloxane polymer liquid and the dielectric gel is a mixture of a first silicone elastomer and a second silicone elastomer. In some embodiments, the filler layer 330 is formed from X %, by weight, polydimethylsiloxane polymer liquid, Y %, by weight, a first silicone elastomer, and Z %, by weight, a second silicone elastomer, where X, Y, and Z sum to 100. In some embodiments, the polydimethylsiloxane polymer liquid has the chemical formula $(CH_3)_3SiO[SiO(CH_3)_2]_n Si(CH_3)_3$, where n is a range of integers chosen such that the polymer liquid has an average bulk viscosity that falls in the range between 50 centistokes and 100,000 centistokes. In some embodiments, first silicone elastomer includes at least sixty percent, by weight, dimethylvinyl-terminated dimethyl siloxane and between 3 and 7 percent by weight silicate. In some embodiments, the second silicone elastomer includes: (i) at least sixty percent, by weight, dimethylvinyl-terminated dimethyl siloxane; (ii) between ten and thirty percent by weight hydrogen-terminated dimethyl siloxane; and (iii) between 3 and 7 percent by weight trimethylated silica. In some embodiments, X is between 30 and 90; Y is between 2 and 20; and Z is between 2 and 20.

In some embodiments, the filler layer 330 includes a silicone gel composition, including: (A) 100 parts by weight of a first polydiorganosiloxane containing an average of at least two silicon-bonded alkenyl groups per molecule and having a viscosity of from 0.2 to 10 Pa·s at 25° C.; (B) at least about 0.5 part by weight to about 10 parts by weight of a second polydiorganosiloxane containing an average of at least two silicon-bonded alkenyl groups per molecule, wherein the second polydiorganosiloxane has a viscosity at 25° C. of at least four times the viscosity of the first polydiorganosiloxane at 25° C.; (C) an organohydrogensiloxane having the average formula $R_7Si(SiOR^8_2H)_3$ where $R^7$ is an alkyl group having 1 to 18 carbon atoms or aryl, $R^8$ is an alkyl group having 1 to 4 carbon atoms, in an amount sufficient to provide from 0.1 to 1.5 silicon-bonded hydrogen atoms per alkenyl group in components (A) and (B) combined; and (D) a hydrosilylation catalyst in an amount sufficient to cure the composition as disclosed in U.S. Pat. No. 6,169,155, which is hereby incorporated by reference herein in its entirety.

Exemplary Semiconductor Junctions

Some examples of semiconductor junctions suitable for use in photovoltaic module 402 will now be described with reference to FIGS. 5A and 5B.

Figure 5A:
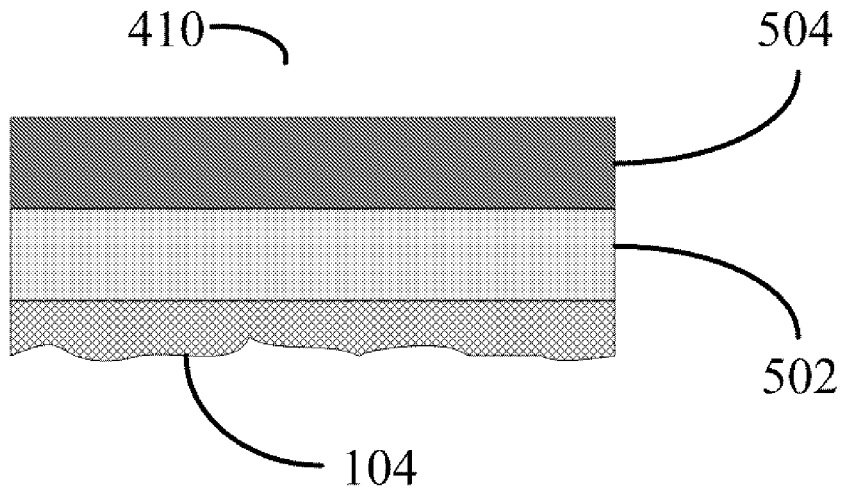
FIGS. 5A-5B illustrate exemplary semiconductor junctions in accordance with some embodiments of the present application.
Figure 5B:
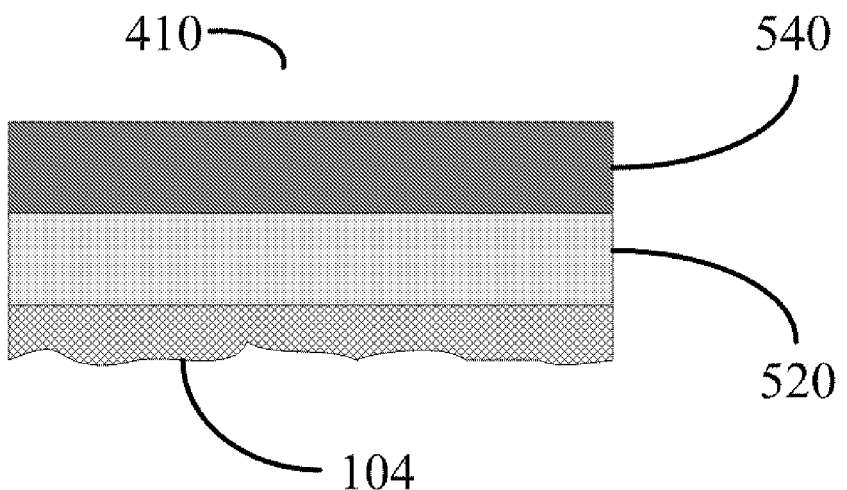
Figure 6:
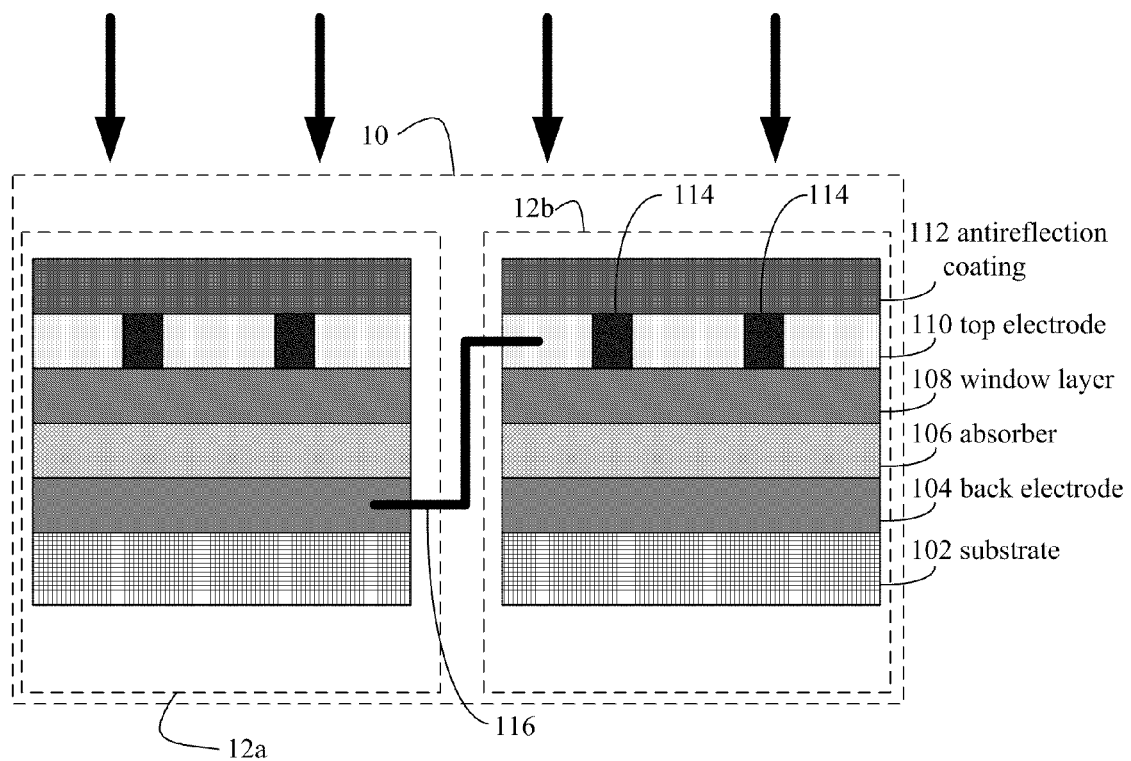
FIG. 6 illustrates interconnected solar cells of a photovoltaic module in accordance with the prior art.

Referring to FIG. 5A, in one embodiment, the semiconductor junction 410 is a heterojunction between an absorber layer 502, disposed on the back-electrode 104, and a junction partner layer 504, disposed on the absorber layer 502. Layers 502 and 504 include different semiconductors with different band gaps and electron affinities such that junction partner layer 504 has a larger band gap than the absorber layer 502. In some embodiments, the absorber layer 502 is p-doped and the junction partner layer 504 is n-doped. In such embodiments, the transparent conductor 110 is n+-doped. In alternative embodiments, the absorber layer 502 is n-doped and the junction partner layer 504 is p-doped. In such embodiments, the transparent conductor 110 is p+-doped. In some embodiments, the semiconductors listed in Pandey, Handbook of Semiconductor Electrodeposition, Marcel Dekker Inc., 1996, Appendix 5, which is hereby incorporated by reference herein in its entirety, are used to form the semiconductor junction 410.

Thin-film semiconductor junctions based on copper indium diselenide and other type I-III-VI materials. Continuing to refer to FIG. 5A, in some embodiments, the absorber layer 502 is a group I-III-VI$_2$ compound such as copper indium di-selenide ($CuInSe_2$; also known as CIS). In some embodiments, the absorber layer 502 is a group I-III-VI$_2$ ternary compound selected from the group consisting of $CdGeAs_2$, $ZnSnAs_2$, $CuInTe_2$, $AgInTe_2$, $CuInSe_2$, $CuGaTe_2$, $ZnGeAs_2$, $CdSnP_2$, $AgInSe_2$, $AgGaTe_2$, $CuInS_2$, $CdSiAs_2$, $ZnSnP_2$, $CdGeP_2$, $ZnSnAs_2$, $CuGaSe_2$, $AgGaSe_2$, $AgInS_2$, $ZnGeP_2$, $ZnSiAs_2$, $ZnSiP_2$, $CdSiP_2$, or $CuGaS_2$ of either the p-type or the n-type when such compound is known to exist.

In some embodiments, the junction partner layer 504 is CdS, ZnS, ZnSe, or CdZnS. In one embodiment, the absorber layer 502 is p-type CIS and the junction partner layer 504 is n⁻ type CdS, ZnS, ZnSe, or CdZnS. Such semiconductor junctions 410 are described in Chapter 6 of Bube, *Photovoltaic Materials*, 1998, Imperial College Press, London, which is hereby incorporated by reference herein in its entirety. Such semiconductor junctions 410 are described in Chapter 6 of Bube, *Photovoltaic Materials*, 1998, Imperial College Press, London, which is hereby incorporated by reference herein in its entirety.

In some embodiments, the absorber layer 502 is copper-indium-gallium-diselenide (CIGS). Such a layer is also known as $Cu(InGa)Se_2$. In some embodiments, the absorber layer 502 is copper-indium-gallium-diselenide (CIGS) and the junction partner layer 504 is CdS, ZnS, ZnSe, or CdZnS. In some embodiments, the absorber layer 502 is p-type CIGS and the junction partner layer 504 is n-type CdS, ZnS, ZnSe, or CdZnS. Such semiconductor junctions 410 are described in Chapter 13 of *Handbook of Photovoltaic Science and Engineering*, 2003, Luque and Hegedus (eds.), Wiley & Sons, West Sussex, England, Chapter 12, which is hereby incorporated by reference herein in its entirety. In some embodiments, CIGS is deposited using techniques disclosed in Beck and Britt, Final Technical Report, January 2006, NREL/SR-520-39119; and Delahoy and Chen, August 2005, "Advanced CIGS Photovoltaic Technology," subcontract report; Kapur et al., January 2005 subcontract report, NREL/SR-520-37284, "Lab to Large Scale Transition for Non-Vacuum Thin Film CIGS Solar Cells"; Simpson et al., October 2005 subcontract report, "Trajectory-Oriented and Fault-Tolerant-Based Intelligent Process Control for Flexible CIGS PV Module Manufacturing," NREL/SR-520-38681; and Ramanathan et al., 31$^{st}$ IEEE Photovoltaics Specialists Conference and Exhibition, Lake Buena Vista, Fla., Jan. 3-7, 2005, each of which is hereby incorporated by reference herein in its entirety.

In some embodiments the absorber layer 502 is CIGS grown on a molybdenum back-electrode 104 by evaporation from elemental sources in accordance with a three stage process described in Ramanthan et al., 2003, "Properties of 19.2% Efficiency $ZnO/CdS/CuInGaSe_2$ Thin-film Solar Cells," Progress in Photovoltaics: Research and Applications 11, 225, which is hereby incorporated by reference herein in its entirety. In some embodiments the layer 504 is a ZnS(O, OH) buffer layer as described, for example, in Ramanathan et al, Conference Paper, "CIGS Thin-Film Solar Research at NREL: FY04 Results and Accomplishments," NREL/CP-520-37020, January 2005, which is hereby incorporated by reference herein in its entirety.

In some embodiments, the layer 502 is between 0.5 μm and 2.0 μm thick. In some embodiments, the composition ratio of Cu/(In+Ga) in the layer 502 is between 0.7 and 0.95. In some embodiments, the composition ratio of Ga/(In+Ga) in the layer 502 is between 0.2 and 0.4. In some embodiments the CIGS absorber has a <110> crystallographic orientation. In some embodiments the CIGS absorber has a <112> crystallographic orientation. In some embodiments the CIGS absorber is randomly oriented.

Semiconductor junctions based on gallium arsenide and other type III-V materials. In some embodiments, the semiconductor junctions 410 are based upon gallium arsenide (GaAs) or other III-V materials such as InP, AlSb, and CdTe. GaAs is a direct-band gap material having a band gap of 1.43 eV and can absorb 97% of AM1 radiation in a thickness of about two microns. Suitable type III-V junctions that can serve as semiconductor junctions 410 of the present application are described in Chapter 4 of Bube, *Photovoltaic Materials*, 1998, Imperial College Press, London, which is hereby incorporated by reference in its entirety.

Furthermore, in some embodiments, the semiconductor junction 410 is a hybrid multijunction solar cell such as a GaAs/Si mechanically stacked multijunction as described by Gee and Virshup, 1988, 20$^{th}$ *IEEE Photovoltaic Specialist Conference*, IEEE Publishing, New York, p. 754, which is hereby incorporated by reference herein in its entirety, a $GaAs/CuInSe_2$ MSMJ four-terminal device, consisting of a GaAs thin film top cell and a $ZnCdS/CuInSe_2$ thin bottom cell described by Stanbery et al., 19$^{th}$ *IEEE Photovoltaic Specialist Conference*, IEEE Publishing, New York, p. 280, and Kim et al., 20$^{th}$ *IEEE Photovoltaic Specialist Conference*, IEEE Publishing, New York, p. 1487, each of which is hereby incorporated by reference herein in its entirety. Other hybrid multijunction solar cells are described in Bube, *Photovoltaic Materials*, 1998, Imperial College Press, London, pp. 131-132, which is hereby incorporated by reference herein in its entirety.

Semiconductor junctions based on cadmium telluride and other type II-VI materials. In some embodiments, the semiconductor junctions 410 are based upon II-VI compounds that can be prepared in either the n-type or the p-type form. Accordingly, in some embodiments, referring to FIG. 5B, the semiconductor junction 410 is a p-n heterojunction in which the layers 520 and 540 are any combination set forth in the following table or alloys thereof.

| Layer 520 | Layer 540 |
|---|---|
| n-CdSe | p-CdTe |
| n-ZnCdS | p-CdTe |
| n-ZnSSe | p-CdTe |
| p-ZnTe | n-CdSe |
| n-CdS | p-CdTe |
| n-CdS | p-ZnTe |
| p-ZnTe | n-CdTe |
| n-ZnSe | p-CdTe |
| n-ZnSe | p-ZnTe |
| n-ZnS | p-CdTe |
| n-ZnS | p-ZnTe |

Methods for manufacturing semiconductor junctions 410 based upon II-VI compounds are described in Chapter 4 of Bube, *Photovoltaic Materials*, 1998, Imperial College Press, London, which is hereby incorporated by reference herein in its entirety.

Additional Optional Layers and Components

As noted above, the nonplanar photovoltaic module 402 can include layers other than those illustrated in FIGS. 2A-2F.

Optional water resistant layer. In some embodiments, one or more layers of water resistant material are coated over the photovoltaic module to waterproof the photovoltaic module. In some embodiments, this water resistant layer is coated onto the transparent conductor 110, the optional filler layer 330, the optional transparent casing 310, and/or an optional anti-reflective coating described below. For example, in some embodiments, such water resistant layers are circumferentially disposed onto the optional filler layer 330 prior to encasing the photovoltaic module 402 in optional transparent casing 310. In some embodiments, such water resistant layers are circumferentially disposed onto transparent casing 310 itself. In embodiments where a water resistant layer is provided to waterproof the photovoltaic module, the optical properties of the water resistant layer are chosen so that they do not interfere with the absorption of incident light by the photovoltaic module. In some embodiments, the water resistant layer is made of clear silicone, SiN, $SiO_xN_y$, $SiO_x$, or $Al_2O_3$, where x and y are integers. In some embodiments, the water resistant layer is made of a Q-type silicone, a silsequioxane, a D-type silicone, or an M-type silicone.

Optional antireflective coating. In some embodiments, an optional antireflective coating is also disposed onto the transparent conductor 110, the optional filler layer 330, the optional transparent casing 310, and/or the optional water resistant layer described above in order to maximize solar cell efficiency. In some embodiments, there is a both a water resistant layer and an antireflective coating deposited on the transparent conductor 110, the optional filler layer 330, and/ or the optional transparent casing 310.

In some embodiments, a single layer serves the dual purpose of a water resistant layer and an anti-reflective coating. In some embodiments, the antireflective coating is made of $MgF_2$, silicone nitride, titanium nitride, silicon monoxide (SiO), or silicon oxide nitride. In some embodiments, there is more than one layer of antireflective coating. In some embodiments, there is more than one layer of antireflective coating and each layer is made of the same material. In some embodiments, there is more than one layer of antireflective coating and each layer is made of a different material.

Optional fluorescent material. In some embodiments, a fluorescent material (e.g., luminescent material, phosphorescent material) is coated on a surface of a layer of the photovoltaic module. In some embodiments, the fluorescent material is coated on the luminal surface and/or the exterior surface of the transparent conductor 110, the optional filler layer 330, and/or the optional transparent casing 310. In some embodiments, the photovoltaic module includes a water resistant layer and the fluorescent material is coated on the water resistant layer. In some embodiments, more than one surface of a photovoltaic module is coated with optional fluorescent material. In some embodiments, the fluorescent material absorbs blue and/or ultraviolet light, which some semiconductor junctions of the present application do not use to convert to electricity, and the fluorescent material emits light in visible and/or infrared light which is useful for electrical generation in some solar cells 300 of the present application.

Fluorescent, luminescent, or phosphorescent materials can absorb light in the blue or UV range and emit visible light. Phosphorescent materials, or phosphors, usually include a suitable host material and an activator material. The host materials are typically oxides, sulfides, selenides, halides or silicates of zinc, cadmium, manganese, aluminum, silicon, or various rare earth metals. The activators are added to prolong the emission time.

In some embodiments of the application, phosphorescent materials are incorporated in the systems and methods of the present application to enhance light absorption by the solar cells of the nonplanar photovoltaic module 402. In some embodiments, the phosphorescent material is directly added to the material used to make the optional transparent casing 310. In some embodiments, the phosphorescent materials are mixed with a binder for use as transparent paints to coat various outer or inner layers of the solar cells 12 of the photovoltaic module 402, as described above.

Exemplary phosphors include, but are not limited to, copper-activated zinc sulfide (ZnS:Cu) and silver-activated zinc sulfide (ZnS:Ag). Other exemplary phosphorescent materials include, but are not limited to, zinc sulfide and cadmium sulfide (ZnS:CdS), strontium aluminate activated by europium ($SrAlO_3$:Eu), strontium titanium activated by praseodymium and aluminum (SrTiO3:Pr, Al), calcium sulfide with strontium sulfide with bismuth ((Ca,Sr)S:Bi), copper and magnesium activated zinc sulfide (ZnS:Cu,Mg), or any combination thereof.

Methods for creating phosphor materials are known in the art. For example, methods of making ZnS:Cu or other related phosphorescent materials are described in U.S. Pat. No. 2,807,587 to Butler et al.; U.S. Pat. No. 3,031,415 to Morrison et al.; U.S. Pat. No. 3,031,416 to Morrison et al.; U.S. Pat. No. 3,152,995 to Strock; U.S. Pat. No. 3,154,712 to Payne; U.S. Pat. No. 3,222,214 to Lagos et al.; U.S. Pat. No. 3,657, 142 to Poss; U.S. Pat. No. 4,859,361 to Reilly et al., and U.S. Pat. No. 5,269,966 to Karam et al., each of which is hereby incorporated by reference herein in its entirety. Methods for making ZnS:Ag or related phosphorescent materials are described in U.S. Pat. No. 6,200,497 to Park et al., U.S. Pat. No. 6,025,675 to Ihara et al.; U.S. Pat. No. 4,804,882 to Takahara et al., and U.S. Pat. No. 4,512,912 to Matsuda et al., each of which is hereby incorporated by reference herein in its entirety. Generally, the persistence of the phosphor increases as the wavelength decreases. In some embodiments, quantum dots of CdSe or similar phosphorescent material can be used to get the same effects. See Dabbousi et al., 1995, "Electroluminescence from CdSe quantum-dot/polymer composites," Applied Physics Letters 66 (11): 1316-1318; Dabbousi et al., 1997 "(CdSe)ZnS Core-Shell Quantum Dots: Synthesis and Characterization of a Size Series of Highly Luminescent Nanocrystallites," J. Phys. Chem. B, 101: 9463-9475; Ebenstein et al., 2002, "Fluorescence quantum yield of CdSe:ZnS nanocrystals investigated by correlated atomic-force and single-particle fluorescence microscopy," Applied Physics Letters 80: 1023-1025; and Peng et al., 2000, "Shape control of CdSe nanocrystals," Nature 404: 59-61; each of which is hereby incorporated by reference herein in its entirety.

In some embodiments, optical brighteners are used in the optional fluorescent layers of the present application. Optical brighteners (also known as optical brightening agents, fluorescent brightening agents or fluorescent whitening agents) are dyes that absorb light in the ultraviolet and violet region of the electromagnetic spectrum, and re-emit light in the blue region. Such compounds include stilbenes (e.g., trans-1,2-diphenylethylene or (E)-1,2-diphenylethene). Another exemplary optical brightener that can be used in the optional fluorescent layers of the present application is umbelliferone (7-hydroxycoumarin), which also absorbs energy in the UV portion of the spectrum. This energy is then re-emitted in the blue portion of the visible spectrum. More information on optical brighteners is in Dean, 1963, *Naturally Occurring Oxygen Ring Compounds*, Butterworths, London; Joule and Mills, 2000, *Heterocyclic Chemistry*, $4^{th}$ edition, Blackwell Science, Oxford, United Kingdom; and Barton, 1999, *Comprehensive Natural Products Chemistry* 2: 677, Nakanishi and Meth-Cohn eds., Elsevier, Oxford, United Kingdom, 1999, each of which is hereby incorporated by reference herein in its entirety.

Layer construction. In some embodiments, some of the afore-mentioned layers are constructed using cylindrical magnetron sputtering techniques, conventional sputtering methods, or reactive sputtering methods on long tubes or strips. Sputtering coating methods for long tubes and strips are disclosed in for example, Hoshi et al., 1983, "Thin Film Coating Techniques on Wires and Inner Walls of Small Tubes via Cylindrical Magnetron Sputtering," *Electrical Engineering in Japan* 103:73-80; Lincoln and Blickensderfer, 1980, "Adapting Conventional Sputtering Equipment for Coating Long Tubes and Strips," *J. Vac. Sci. Technol.* 17:1252-1253; Harding, 1977, "Improvements in a dc Reactive Sputtering System for Coating Tubes," *J. Vac. Sci. Technol.* 14:1313-1315; Pearce, 1970, "A Thick Film Vacuum Deposition System for Microwave Tube Component Coating," *Conference Records of* 1970 Conference on Electron Device Techniques 208-211; and Harding et al., 1979, "Production of Properties of Selective Surfaces Coated onto Glass Tubes by a Magnetron Sputtering System," *Proceedings of the International Solar Energy Society* 1912-1916, each of which is hereby incorporated by reference herein in its entirety.

Definitions

About. In some embodiments, the term "about" as used in the present invention means within ±5% of the given (nominal) value. In other embodiments, the term "about" means within ±10% of the given (nominal) value. In yet other embodiments, the term "about" means within ±20% of the given (nominal) value.

Substantially. In some embodiments, the term "substantially" as used in the present invention means within ±5% of the given (nominal) value. In other embodiments, the term "substantially" means within ±10% of the given (nominal) value. In yet other embodiments, the term "substantially" means within ±20% of the given (nominal) value.

Circumferentially disposed. In some embodiments of the present application, layers of material are successively circumferentially disposed on a non-planar elongated substrate in order to form the solar cells 12 of a photovoltaic module 402 as well as the encapsulating layers of the photovoltaic module such as filler layer 330 and the casing 310. As used herein, the term "circumferentially disposed" is not intended to imply that each such layer of material is necessarily deposited on an underlying layer or that the shape of the solar cell 12 and/or photovoltaic module 402 and/or substrate is cylindrical. In fact, the present application discloses methods by which such layers are molded or otherwise formed on an underlying layer. Further, as discussed above in conjunction with the discussion of the substrate 102, the substrate and underlying layers may have any of several different planar or nonplanar shapes. Nevertheless, the term "circumferentially disposed" means that an overlying layer is disposed on an underlying layer such that there is no space (e.g., no annular space) between the overlying layer and the underlying layer. Furthermore, as used herein, the term "circumferentially disposed" means that an overlying layer is disposed on at least fifty percent of the perimeter of the underlying layer. Furthermore, as used herein, the term "circumferentially disposed" means that an overlying layer is disposed along at least half of the length of the underlying layer. Furthermore, as used herein, the term "disposed" means that one layer is disposed on an underlying layer without any space between the two layers. So, if a first layer is disposed on a second layer, there is no space between the two layers. Furthermore, as used herein, the term circumferentially disposed means that an overlying layer is disposed on at least twenty percent, at least thirty percent, at least forty, percent, at least fifty percent, at least sixty percent, at least seventy percent, or at least eighty percent of the perimeter of the underlying layer. Furthermore, as used herein, the term circumferentially disposed means that an overlying layer is disposed along at least half of the length, at least seventy-five percent of the length, or at least ninety-percent of the underlying layer.

Rigid. In some embodiments, the substrate 102 is rigid. Rigidity of a material can be measured using several different metrics including, but not limited to, Young's modulus. In solid mechanics, Young's Modulus (E) (also known as the Young Modulus, modulus of elasticity, elastic modulus or tensile modulus) is a measure of the stiffness of a given material. It is defined as the ratio, for small strains, of the rate of change of stress with strain. This can be experimentally determined from the slope of a stress-strain curve created during tensile tests conducted on a sample of the material. Young's modulus for various materials is given in the following table.

| Material | Young's modulus (E) in GPa | Young's modulus (E) in lbf/in² (psi) |
|---|---|---|
| Rubber (small strain) | 0.01-0.1 | 1,500-15,000 |
| Low density polyethylene | 0.2 | 30,000 |
| Polypropylene | 1.5-2 | 217,000-290,000 |
| Polyethylene terephthalate | 2-2.5 | 290,000-360,000 |
| Polystyrene | 3-3.5 | 435,000-505,000 |
| Nylon | 3-7 | 290,000-580,000 |
| Aluminum alloy | 69 | 10,000,000 |
| Glass (all types) | 72 | 10,400,000 |
| Brass and bronze | 103-124 | 17,000,000 |
| Titanium (Ti) | 105-120 | 15,000,000-17,500,000 |
| Carbon fiber reinforced plastic (unidirectional, along grain) | 150 | 21,800,000 |
| Wrought iron and steel | 190-210 | 30,000,000 |
| Tungsten (W) | 400-410 | 58,000,000-59,500,000 |
| Silicon carbide (SiC) | 450 | 65,000,000 |
| Tungsten carbide (WC) | 450-650 | 65,000,000-94,000,000 |
| Single Carbon nanotube | 1,000+ | 145,000,000 |
| Diamond (C) | 1,050-1,200 | 150,000,000-175,000,000 |

In some embodiments of the present application, a material (e.g., substrate 102) is deemed to be rigid when it is made of a material that has a Young's modulus of 20 GPa or greater, 30 GPa or greater, 40 GPa or greater, 50 GPa or greater, 60 GPa or greater, or 70 GPa or greater. In some embodiments of the present application a material (e.g., the substrate 102) is deemed to be rigid when the Young's modulus for the material is a constant over a range of strains. Such materials are called linear, and are said to obey Hooke's law. Thus, in some embodiments, the substrate 102 is made out of a linear material that obeys Hooke's law. Examples of linear materials include, but are not limited to, steel, carbon fiber, and glass. Rubber and soil (except at very low strains) are non-linear materials. In some embodiments, a material is considered rigid when it adheres to the small deformation theory of elasticity, when subjected to any amount of force in a large range of forces (e.g., between 1 dyne and $10^5$ dynes, between 1000 dynes and $10^6$ dynes, between 10,000 dynes and $10^7$ dynes), such that the material only undergoes small elongations or shortenings or other deformations when subject to such force. The requirement that the deformations (or gradients of deformations) of such exemplary materials are small means, mathematically, that the square of either of these quantities is negligibly small when compared to the first power of the quantities when exposed to such a force. Another way of stating the requirement for a rigid material is that such a material, over a large range of forces (e.g., between 1 dyne and $10^5$ dynes, between 1000 dynes and $10^6$ dynes, between 10,000 dynes and $10^7$ dynes), is well characterized by a strain tensor that only has linear terms. The strain tensor for materials is described in Borg, 1962, *Fundamentals of Engineer-*

*ing Elasticity*, Princeton, N.J., pp. 36-41, which is hereby incorporated by reference herein in its entirety. In some embodiments, a material is considered rigid when a sample of the material of sufficient size and dimensions does not substantially bend under a force of 9.8 m/sec$^2$.

Non-planar. The present application is not limited to solar cells and substrates that have rigid cylindrical shapes or are solid rods. In some embodiments, all or a portion of the substrate 102 can be characterized by a cross-section bounded by any one of a number of shapes other than the circular shape depicted in FIG. 2B. The bounding shape can be any one of circular, ovoid, or any shape characterized by one or more smooth curved surfaces, or any splice of smooth curved surfaces. The bounding shape can be an n-gon, where n is 3, 4, 5, or greater than 5. The bounding shape can also be linear in nature, including triangular, rectangular, pentangular, hexagonal, or having any number of linear segmented surfaces. Or, the cross-section can be bounded by any combination of linear surfaces, arcuate surfaces, or curved surfaces. As described herein, for ease of discussion only, an omni-facial circular cross-section is illustrated to represent non-planar embodiments of the photovoltaic module. However, it should be noted that any cross-sectional geometry may be used in a photovoltaic module that is non-planar in practice.

In some embodiments, the elongated substrate 102 has a solid core, as illustrated in FIGS. 2A-2F, while in other embodiments, the elongated substrate 102 has a hollow core. In some embodiments, the shape of the elongated substrate 102 is only approximately that of a cylindrical object, meaning that a cross-section taken at a right angle to the length of the elongated substrate 102 defines an ellipse rather than a circle. As the term is used herein, such approximately shaped objects are still considered cylindrically shaped in the present application. In some embodiments, the elongated substrate 102 is flat planar while in other embodiments the elongated substrate 102 is nonplanar.

In some embodiments, a first portion of the substrate 102 is characterized by a first cross-sectional shape and a second portion of the substrate 102 is characterized by a second cross-sectional shape, where the first and second cross-sectional shapes are the same or different. In some embodiments, at least zero percent, at least ten percent, at least twenty percent, at least thirty percent, at least forty percent, at least fifty percent, at least sixty percent, at least seventy percent, at least eighty percent, at least ninety percent, or all of the length of the substrate 102 is characterized by the first cross-sectional shape, and some or all of the remainder of the length of the substrate is characterized by the second cross-sectional shape. In some embodiments, the first cross-section shape is planar (e.g., has no arcuate side), and the second cross-sectional shape has at least one arcuate side.

Exemplary Embodiments

Under one aspect, a method of patterning a photovoltaic module comprising a nonplanar back-electrode layer around a nonplanar substrate includes: (a) scribing the nonplanar back-electrode layer thereby forming a continuous first groove in the back-electrode that traverses a perimeter of the back-electrode a plurality of times; (b) disposing a semiconductor junction around the back-electrode layer after the scribing step (a); (c) scribing the semiconductor junction thereby forming a continuous second groove in the semiconductor junction that traverses a perimeter of the semiconductor junction a plurality of times; (d) disposing a transparent conductor layer around the semiconductor junction after the scribing step (c); (e) scribing the transparent conductor layer thereby forming a continuous third groove in the transparent conductor layer that traverses a perimeter of the transparent conductor layer a plurality of times; and (f) scribing the back-electrode layer, the semiconductor junction, and the transparent conductor layer along a length of the photovoltaic module thereby forming a fourth groove, wherein the fourth groove and at least one of the first groove, the second groove, and the third groove define a plurality of solar cells, wherein each solar cell in the plurality of solar cells comprises a portion of the back electrode layer bounded by the first groove and the fourth groove, a portion of the semiconductor junction bounded by the second groove and the fourth groove, and a portion of the transparent conductor layer bounded by the third groove and the fourth groove.

In some embodiments, at least one of the first, second, and third grooves has a repeating pattern, a non-repeating pattern, or is helical. In some embodiments, at least one of (a), (c), and (e) is performed with one of a mechanical scriber and a laser scriber. In some embodiments, the mechanical scriber is a constant force mechanical scriber. In some embodiments, at least one of (a), (c), and (e) comprises circumferentially rotating the substrate. In some embodiments, at least one of (a), (c), and (e) comprises moving a scribing mechanism around the photovoltaic module. In some embodiments, (f) comprises longitudinally translating the substrate. In some embodiments, (f) comprises longitudinally translating a scribing mechanism.

In some embodiments, the first groove is a single groove in the back-electrode layer; the second groove is a single groove in the semiconductor junction; and the third groove is a single groove in the transparent conductor layer. In some embodiments, (f) comprises linearly scribing the back-electrode layer, the semiconductor junction, and the transparent conductor layer along the length of the photovoltaic module. In some embodiments, the disposing step (b) comprises disposing an absorber layer on the scribed back-electrode layer; and disposing a junction partner layer on the absorber layer.

In some embodiments, at least one of the first groove, the second groove, and the third groove is helical and is defined by:

$$x = r \cos t$$

$$y = r \sin t$$

$$z = ct$$

wherein $t \in [2, 2\pi)$,
where r is radius of a helix defined by the first groove, the second groove, or the third groove, and $2\pi c$ is a constant giving a vertical separation of each loop in the helix defined by the at least one of the first groove, the second groove, and the third groove. In some embodiments, 1 r is between 10 mm and 10,000 mm, and c is between 0.4 mm and 100 mm. In some embodiments, at least one of the first groove, the second groove, and the third groove is a space curve, wherein the space curve is formed by wrapping a two dimensional curve having a repeating pattern about the photovoltaic module.

In some embodiments, a first solar cell in the plurality of solar cells is electrically connected in series to a second solar cell in the plurality of solar cells. In some embodiments, a first solar cell in the plurality of solar cells is electrically connected in parallel to a second solar cell in the plurality of solar cells.

In some embodiments, the photovoltaic module is cylindrical. In some embodiments, the photovoltaic module is characterized by a cross-section that is circular, ovoid, or an n-gon, wherein n is 3, 4, 5, or greater than 5. In some embodiments, the photovoltaic module is characterized by a cross-section that comprises an arcuate portion. In some embodiments, the photovoltaic module is characterized by a first cross-section and a second cross-section, wherein the first cross-section is bounded by a shape that is different than a shape that bounds the second cross-section.

Under another aspect, a nonplanar photovoltaic module having a length includes: (a) an elongated nonplanar substrate; and (b) a plurality of solar cells disposed on the elongated nonplanar substrate, wherein each solar cell in the plurality of solar cells is defined by (i) a plurality of grooves around the nonplanar photovoltaic module and (ii) a groove along the length of the photovoltaic module.

In some embodiments, each groove of the plurality of grooves about the photovoltaic module, independently, has a repeating pattern, a non-repeating pattern, or is helical. In some embodiments, the module further includes a patterned conductor providing serial electrical communication between adjacent solar cells. In some embodiments, portions of the patterned conductor providing serial electrical communication between adjacent solar cells are within a groove of the plurality of grooves about the photovoltaic module. In some embodiments, each solar cell of the plurality of solar cells comprises a back-electrode layer disposed on the substrate, wherein portions of the back-electrode layer are defined by a first groove of the plurality of grooves about the photovoltaic module and the groove along the length of the photovoltaic module. In some embodiments, each solar cell of the plurality of solar cells further comprises a semiconductor junction disposed on the back-electrode layer, wherein portions of the semiconductor junction are defined by a second groove of the plurality of grooves about the photovoltaic module and the groove along the length of the photovoltaic module. In some embodiments, each solar cell of the plurality of solar cells further comprises a transparent conductor layer disposed on the semiconductor junction, wherein portions of the transparent conductor layer defined by a third groove of the plurality of grooves about the photovoltaic module and the groove along the length of the photovoltaic module. In some embodiments, each solar cell comprises a portion of the back-electrode layer, a portion of the semiconductor junction at least partially overlying the portion of the back-electrode layer, and a portion of the transparent conductor layer at least partially overlying the portion of the semiconductor junction. In some embodiments, portions of the transparent conductor layer are in the second groove and provide electrical communication between the portion of the back-electrode layer of a first solar cell of the plurality of solar cells and the portion of the transparent conductor layer of a second solar cell of the plurality of solar cells, wherein the first solar cell is adjacent to the second solar cell. In some embodiments, the first, second, and third grooves are laterally offset from each other.

In some embodiments, the module further includes a substantially transparent casing circumferentially disposed on the plurality of solar cells. In some embodiments, the groove along the length of the photovoltaic module is linear. In some embodiments, the plurality of solar cells comprises at least ten solar cells.

Under another aspect, a photovoltaic module comprising a nonplanar back-electrode around a nonplanar substrate is formed by: (a) scribing the non-planar back-electrode layer thereby forming a continuous first groove in the back-electrode that traverses a perimeter of the back-electrode a plurality of time; (b) disposing a semiconductor junction around the back-electrode layer after the scribing step (a); (c) scribing the semiconductor junction thereby forming a continuous second groove in the semiconductor junction that traverses a perimeter of the semiconductor junction a plurality of times; (d) disposing a transparent conductor layer on the semiconductor junction after the scribing step (c); (e) scribing the transparent conductor layer thereby forming a continuous third groove in the transparent conductor layer that traverses a perimeter of the transparent conductor layer a plurality of times; and (f) scribing the back-electrode layer, the semiconductor junction, and the transparent conductor layer a length of the photovoltaic module thereby forming a fourth groove, wherein the fourth groove and at least one of the first groove, the second groove, and the third groove define a plurality of solar cells, wherein each solar cell in the plurality of solar cells comprises a portion of the back-electrode layer bounded by the first groove and the fourth groove, a portion of the semiconductor junction bounded by the second groove and the fourth groove, and a portion of the transparent conductor layer bounded by the third groove and the fourth groove.

In some embodiments, at least one of the first, second, and third grooves has a repeating pattern, a non-repeating pattern, or is helical. In some embodiments, at least one of (a), (c), and (e) is performed with one of a mechanical scriber and a laser scriber. In some embodiments, the mechanical scriber comprises a constant force mechanical scriber. In some embodiments, at least one of (a), (c), and (e) comprises circumferentially rotating the substrate. In some embodiments, at least one of (a), (c), and (e) comprises moving a scribing mechanism around the photovoltaic module. In some embodiments, (f) comprises longitudinally translating the substrate. In some embodiments, (f) comprises longitudinally translating a scribing mechanism.

In some embodiments, the first groove is a single groove in the back-electrode layer; the second groove is a single groove in the semiconductor junction; and the third groove is a single groove in the transparent conductor layer. In some embodiments, the single groove in at least one of the back-electrode layer, semiconductor junction, and transparent conductor layer has a width of between about 10 microns and about 300 microns. In some embodiments, the single groove in at least one of the back-electrode layer, semiconductor junction, and transparent conductor layer has a width of between about 50 microns and about 150 microns. In some embodiments, the fourth groove is linear. In some embodiments, the disposing step (b) comprises: disposing an absorber layer on the back-electrode layer; and disposing a junction partner layer on the absorber layer.

In some embodiments, at least one of the first groove, the second groove, and the third groove is helical and is defined by:

$$x = r \cos t$$

$$y = r \sin t$$

$$z = ct$$

wherein $t \in [2, 2\pi)$, where r is radius of a helix defined by the first groove, the second groove, or the third groove, and $2\pi c$ is a constant giving a vertical separation of each loop in the helix defined by the at least one of the first groove, the second groove, and the third groove. In some embodiments, r is between 10 mm and 10,000 mm, and c is between 0.4 mm and 100 mm. In some embodiments, at least one of the first groove, the second groove, and the third groove is a space curve, wherein the space curve is formed by wrapping a two dimensional curve having a repeating pattern about the photovoltaic module.

In some embodiments, the plurality of solar cells comprises at least ten solar cells. In some embodiments, the plurality of solar cells comprises at least fifty solar cells.

Under another aspect, a method of creating a non-unifacial photovoltaic module around an elongated substrate includes: (a) disposing a first material on the elongated substrate to form a back electrode; (b) disposing one or more photovoltaic materials on the back electrode to form a photovoltaic layer; (c) disposing a second material on the photovoltaic layer to form a front electrode; (d) patterning any of the back electrode, the photovoltaic layer, and the front electrode layer to form a cell boundary. The patterning includes: traversing a first path in the any of the back electrode, the photovoltaic layer, and the front electrode layer in (i) a first orientation directed along a width of the elongated substrate, and (ii) a second orientation directed along a length of the elongated substrate, the traversing in (i) the first orientation occurring substantially concurrently with the traversing in (ii) the second orientation so that the first path includes a component in the first orientation and a component in the second orientation.

In some embodiments, the first path traverses a perimeter of the any of the back electrode, the photovoltaic layer, and the front electrode layer a plurality of times.

Under another aspect, a photovoltaic module having a length dimension and a width dimension includes an elongated substrate; a plurality of photovoltaic components comprising: a first material disposed on the elongated substrate to form a back electrode; one or more photovoltaic materials disposed on the back electrode to form a photovoltaic layer; and a second material disposed on the photovoltaic layer to form a front electrode. The module also includes one or more solar cells formed from the plurality of photovoltaic components such that the one or more solar cells are operable to generate electricity from light impinging the one or more solar cells from a range of directions spanning more than 180 degrees about the length dimension or the width dimension of the photovoltaic module. The module also includes an electrical boundary within at least one photovoltaic component in the plurality of photovoltaic components, the electrical boundary being formed by patterning any of the first material, the photovoltaic layer, and the second material, the patterning comprising forming a filled or unfilled via following a path comprising a first component and a second component, wherein: the first component is a first orientation directed along a width of the elongated substrate, and the second component is a second orientation directed along a length of the elongated substrate. The forming advances substantially concurrently (i) in the first orientation at a first rate and (ii) in the second orientation at a second rate.

In some embodiments, at least one of the first and second rates is variable. In some embodiments, In some embodiments, the first rate is different from the second rate. In some embodiments, the electrical boundary is an isolation boundary. In some embodiments, the electrical boundary defines a serial electrical connection between solar cells that share the electrical boundary. In some embodiments, the electrical boundary defines a parallel electrical connection between solar cells that share the electrical boundary. In some embodiments, the first path traverses a perimeter of the any of the back electrode, the photovoltaic junction, and the front electrode a plurality of times.

Under another aspect, a method of patterning a conductive layer disposed around a nonplanar substrate includes scribing the conductive layer thereby forming a continuous groove that traverses a perimeter of the conductive layer a plurality of times.

In some embodiments, the conductive layer comprises at least one of a metal, a semiconductor, a conductive polymer, and an insulator. In some embodiments, the nonplanar substrate comprises at least one of metal, a semiconductor, a conductive polymer, and an insulator. In some embodiments, the nonplanar substrate is unifacial. In some embodiments, the unifacial nonplanar substrate is cylindrical. In some embodiments, the nonplanar substrate is multifacial. In some embodiments, the nonplanar substrate is bifacial. In some embodiments, the nonplanar substrate has a width and a length that is at least three times larger than the width. In some embodiments, the length is at least ten times larger than the width. In some embodiments, the conductive layer has a thickness, and scribing the conductive layer comprises forming a continuous groove through the thickness of the conductive layer. In some embodiments, the groove has a repeating pattern, a non-repeating pattern, or is helical. In some embodiments, scribing the conductive layer is performed with one of a mechanical scriber and a laser scriber. In some embodiments, the mechanical scriber is a constant force mechanical scriber. In some embodiments, scribing the conductive layer comprises rotating the substrate about a long axis of the substrate. In some embodiments, scribing the conductive layer comprises moving a scribing mechanism around the substrate. In some embodiments, scribing the conductive layer thereby forming a continuous groove that extends along a length of the substrate. In some embodiments, forming the continuous groove that extends along the length of the substrate comprises longitudinally translating the substrate. In some embodiments, forming the continuous groove that extends along the length of the substrate comprises longitudinally translating a scribing mechanism. In some embodiments, the continuous groove that extends along the length of the substrate is linear, has a repeating pattern, or has a non-repeating pattern. Some embodiments further includes forming a conductive layer overlying the scribed conductor layer.

Under another aspect, a patterned conductive layer is disposed around a nonplanar substrate, wherein a boundary of the conductive layer is defined by a single groove that traverses a perimeter of the substrate a plurality of times.

Under another aspect, a patterned conductive layer is disposed around a nonplanar substrate, wherein the patterned conductive layer is divided into a plurality of conductive islands by a groove that extends through a thickness of the conductive layer and traverses a perimeter of the substrate a plurality of times, and a groove extends through the thickness of the conductive layer and traverses a length of the substrate.

RELATED APPLICATIONS

This application is related to the following applications, the entire contents of each of which are incorporated by reference herein: U.S. Pat. No. 7,235,736, filed on Mar. 18, 2006 and entitled "Monolithic Integration of Cylindrical Solar Cells;" U.S. Provisional Patent Application No. 60/976,401, filed on Sep. 28, 2007 and entitled "Scribing Methods for Photovoltaic Modules Including a Mechanical Scribe;" U.S. Provisional Patent Application No. 60/980,372, filed on Oct. 16, 2007 and entitled "Constant Force Mechanical Scribers and Methods for Using Same In Semiconductor Processing Applications;" and U.S. Provisional Patent Application No. 61/082,148, filed on Jul. 18, 2008 and entitled "Elongated Semiconductor Devices, Methods of Making Same, and Systems for Making Same."

INCORPORATION BY REFERENCE

All references cited herein are incorporated herein by reference in their entirety and for all purposes to the same extent as if each individual publication or patent or patent application was specifically and individually indicated to be incorporated by reference in its entirety for all purposes.

Many modifications and variations of this application can be made without departing from its spirit and scope, as will be apparent to those skill in the art. The specific embodiments described herein are offered by way of example only, and the application is to be limited only by the terms of the appended claims, along with the full scope of equivalents to which the claims are entitled.

What is claimed:

1. A method of patterning a photovoltaic module comprising a nonplanar back-electrode layer around a nonplanar substrate, the method comprising:
   a. scribing the nonplanar back-electrode layer thereby forming a first groove in the back-electrode that traverses a perimeter of the back-electrode a plurality of times;
   b. disposing a semiconductor junction around the back-electrode layer after the scribing step (a);
   c. scribing the semiconductor junction thereby forming a second groove in the semiconductor junction that traverses a perimeter of the semiconductor junction a plurality of times;
   d. disposing a transparent conductor layer around the semiconductor junction after the scribing step (c);
   e. scribing the transparent conductor layer thereby forming a third groove in the transparent conductor layer that traverses a perimeter of the transparent conductor layer a plurality of times; and
   f. scribing the back-electrode layer, the semiconductor junction, and the transparent conductor layer along a length of the photovoltaic module thereby forming a fourth groove, wherein the fourth groove and at least one of the first groove, the second groove, and the third groove define a plurality of solar cells, wherein each solar cell in the plurality of solar cells comprises a portion of the back electrode layer bounded by the first groove and the fourth groove, a portion of the semiconductor junction bounded by the second groove and the fourth groove, and a portion of the transparent conductor layer bounded by the third groove and the fourth groove.

2. The method of claim 1, wherein at least one of the first, second, and third grooves has a repeating pattern, a non-repeating pattern, or is helical.

3. The method of claim 1, wherein at least one of (a), (c), and (e) is performed with one of a mechanical scriber and a laser scriber.

4. The method of claim 1, wherein the mechanical scriber is a constant force mechanical scriber.

5. The method of claim 1, wherein at least one of (a), (c), and (e) comprises rotating the substrate about a long axis of the substrate.

6. The method of claim 1, wherein at least one of (a), (c), and (e) comprises moving a scribing mechanism around the photovoltaic module.

7. The method of claim 1, wherein (f) comprises longitudinally translating the substrate.

8. The method of claim 1, wherein (f) comprises longitudinally translating a scribing mechanism.

9. The method of claim 1, wherein:
   the first groove is a single groove in the back-electrode layer;
   the second groove is a single groove in the semiconductor junction; and
   the third groove is a single groove in the transparent conductor layer.

10. The method of claim 1, wherein (f) comprises linearly scribing the back-electrode layer, the semiconductor junction, and the transparent conductor layer along the length of the photovoltaic module.

11. The method of claim 1, wherein the disposing step (b) comprises:
    disposing an absorber layer on the scribed back-electrode layer; and
    disposing a junction partner layer on the absorber layer.

12. The method of claim 1, wherein at least one of the first groove, the second groove, and the third groove is helical and is defined by:

$$x = r \cos t$$

$$y = r \sin t$$

$$z = ct$$

wherein $t \in [2, 2\pi)$,
r is radius of a helix defined by the first groove, the second groove, or the third groove, and
$2\pi c$ is a constant giving a vertical separation of each loop in the helix defined by the at least one of the first groove, the second groove, and the third groove.

13. The method of claim 12, wherein
r is between 10 mm and 10,000 mm, and
c is between 0.4 mm and 100 mm.

14. The method of claim 1, wherein at least one of the first groove, the second groove, and the third groove is a space curve, wherein the space curve is formed by wrapping a two dimensional curve having a repeating pattern about the photovoltaic module.

15. The method of claim 1, wherein a first solar cell in the plurality of solar cells is electrically connected in series to a second solar cell in the plurality of solar cells.

16. The method of claim 1, wherein a first solar cell in the plurality of solar cells is electrically connected in parallel to a second solar cell in the plurality of solar cells.

17. The method of claim 1, wherein the photovoltaic module is cylindrical.

18. The method of claim 1, wherein the photovoltaic module has a cross-section that is ovoid, or an n-gon, wherein n is 3, 4, 5, or greater than 5.

19. The method of claim 1, wherein the photovoltaic module has a cross-section that comprises an arcuate portion.

20. The method of claim 1, wherein the photovoltaic module is characterized by a first cross-section and a second cross-section, wherein the first cross-section is bounded by a shape that is different than a shape that bounds the second cross-section.

21. The method of claim 1, wherein the photovoltaic module has a cross-section that is circular.

22. A photovoltaic module comprising a nonplanar back-electrode around a nonplanar substrate, the photovoltaic module formed by:
    a. scribing the non-planar back-electrode layer thereby forming a continuous first groove in the back-electrode that traverses a perimeter of the back-electrode a plurality of times;
    b. disposing a semiconductor junction around the back-electrode layer after the scribing step (a);
    c. scribing the semiconductor junction thereby forming a continuous second groove in the semiconductor junction that traverses a perimeter of the semiconductor junction a plurality of times;
    d. disposing a transparent conductor layer on the semiconductor junction after the scribing step (c);

e. scribing the transparent conductor layer thereby forming a continuous third groove in the transparent conductor layer that traverses a perimeter of the transparent conductor layer a plurality of times; and f. scribing the back-electrode layer, the semiconductor junction, and the transparent conductor layer along a length of the photovoltaic module thereby forming a fourth groove, wherein the fourth groove and at least one of the first groove, the second groove, and the third groove define a plurality of solar cells, wherein each solar cell in the plurality of solar cells comprises a portion of the back-electrode layer bounded by the first groove and the fourth groove, a portion of the semiconductor junction bounded by the second groove and the fourth groove, and a portion of the transparent conductor layer bounded by the third groove and the fourth groove.

23. The photovoltaic module of claim 22, wherein at least one of the first, second, and third grooves has a repeating pattern, a non-repeating pattern, or is helical.

24. The photovoltaic module of claim 22, wherein at least one of (a), (c), and (e) is performed with one of a mechanical scriber and a laser scriber.

25. The photovoltaic module of claim 22, wherein at least one of (a), (c), and (e) is performed with a constant force mechanical scriber.

26. The photovoltaic module of claim 22, wherein at least one of (a), (c), and (e) comprises circumferentially rotating the nonplanar substrate.

27. The photovoltaic module of claim 22, wherein at least one of (a), (c), and (e) comprises moving a scribing mechanism around the photovoltaic module.

28. The photovoltaic module of claim 22, wherein (f) comprises longitudinally translating the substrate.

29. The photovoltaic module of claim 22, wherein (f) comprises longitudinally translating a scribing mechanism.

30. The photovoltaic module of claim 22, wherein:
the first groove is a single groove in the back-electrode layer;
the second groove is a single groove in the semiconductor junction; and
the third groove is a single groove in the transparent conductor layer.

31. The photovoltaic module of claim 30, wherein the single groove in at least one of the back-electrode layer, semiconductor junction, and transparent conductor layer has a width of between about 10 microns and about 300 microns.

32. The photovoltaic module of claim 30, wherein the single groove in at least one of the back-electrode layer, semiconductor junction, and transparent conductor layer has a width of between about 50 microns and about 150 microns.

33. The photovoltaic module of claim 22, wherein the fourth groove is linear.

34. The photovoltaic module of claim 22, wherein the disposing step (b) comprises:
disposing an absorber layer on the back-electrode layer; and
disposing a junction partner layer on the absorber layer.

35. The photovoltaic module of claim 22, wherein at least one of the first groove, the second groove, and the third groove is helical and is defined by:

$$x = r \cos t$$

$$y = r \sin t$$

$$z = ct$$

wherein $t \in [2, 2\pi)$,
r is radius of a helix defined by the first groove, the second groove, or the third groove, and
$2\pi c$ is a constant giving a vertical separation of each loop in the helix defined by the at least one of the first groove, the second groove, and the third groove.

36. The photovoltaic module of claim 35, wherein
r is between 10 mm and 10,000 mm, and
c is between 0.4 mm and 100 mm.

37. The photovoltaic module of claim 22, wherein at least one of the first groove, the second groove, and the third groove is a space curve, wherein the space curve is formed by wrapping a two dimensional curve having a repeating pattern about the photovoltaic module.

38. The photovoltaic module of claim 22, wherein the plurality of solar cells comprises at least ten solar cells.

39. The photovoltaic module of claim 22, wherein the plurality of solar cells comprises at least fifty solar cells.

* * * * *